United States Patent
Hoang et al.

(10) Patent No.: US 11,568,228 B2
(45) Date of Patent: Jan. 31, 2023

(54) RECURRENT NEURAL NETWORK INFERENCE ENGINE WITH GATED RECURRENT UNIT CELL AND NON-VOLATILE MEMORY ARRAYS

(71) Applicant: SanDisk Technologies LLC, Addison, TX (US)

(72) Inventors: Tung Thanh Hoang, San Jose, CA (US); Wen Ma, Sunnyvale, CA (US); Martin Lueker-Boden, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 357 days.

(21) Appl. No.: 16/908,861

(22) Filed: Jun. 23, 2020

(65) Prior Publication Data

US 2021/0397931 A1    Dec. 23, 2021

(51) Int. Cl.
| | |
|---|---|
| *G06N 3/063* | (2006.01) |
| *G11C 11/54* | (2006.01) |
| *G06F 3/06* | (2006.01) |
| *G06N 3/04* | (2006.01) |

(52) U.S. Cl.
CPC ........... *G06N 3/063* (2013.01); *G06F 3/0604* (2013.01); *G06F 3/0659* (2013.01); *G06F 3/0688* (2013.01); *G06N 3/0445* (2013.01); *G11C 11/54* (2013.01)

(58) Field of Classification Search
CPC .... G06N 3/063; G06N 3/0445; G06F 3/0604; G06F 3/0659; G06F 3/0688; G11C 11/54
USPC .......................................................... 706/30
See application file for complete search history.

(56) References Cited

U.S. PATENT DOCUMENTS

| 7,324,366 B2 | 1/2008 | Bednorz et al. |
| 7,505,347 B2 | 3/2009 | Rinerson et al. |
| 8,416,624 B2 | 4/2013 | Lei et al. |
| 8,634,247 B1 | 1/2014 | Sprouse et al. |

(Continued)

FOREIGN PATENT DOCUMENTS

| CN | 110597555 A | 12/2019 |
| CN | 110598858 A | 12/2019 |

OTHER PUBLICATIONS

Resch, Salonik, et al., "PIMBALL: Binary Neural Networks in Spintronic Memory," ACM Trans. Arch. Code Optim., vol. 37, No. 4, Article 111, Aug. 2018, 25 pages.

(Continued)

*Primary Examiner* — Hai Tao Sun
(74) *Attorney, Agent, or Firm* — Vierra Magen Marcus LLP

(57) ABSTRACT

A non-volatile memory device includes arrays of non-volatile memory cells that are configured to the store weights for a recurrent neural network (RNN) inference engine with a gated recurrent unit (GRU) cell. A set three non-volatile memory arrays, such as formed of storage class memory, store a corresponding three sets of weights and are used to perform compute-in-memory inferencing. The hidden state of a previous iteration and an external input are applied to the weights of the first and the of second of the arrays, with the output of the first array used to generate an input to the third array, which also receives the external input. The hidden state of the current generation is generated from the outputs of the second and third arrays.

20 Claims, 16 Drawing Sheets

(56) References Cited

U.S. PATENT DOCUMENTS

| | | | |
|---|---|---|---|
| 8,634,248 | B1 | 1/2014 | Sprouse et al. |
| 8,773,909 | B2 | 7/2014 | Li et al. |
| 8,780,632 | B2 | 7/2014 | Sprouse et al. |
| 8,780,633 | B2 | 7/2014 | Sprouse et al. |
| 8,780,634 | B2 | 7/2014 | Sprouse et al. |
| 8,780,635 | B2 | 7/2014 | Li et al. |
| 8,792,279 | B2 | 7/2014 | Li et al. |
| 8,811,085 | B2 | 8/2014 | Sprouse et al. |
| 8,817,541 | B2 | 8/2014 | Li et al. |
| 9,098,403 | B2 | 8/2015 | Sprouse et al. |
| 9,104,551 | B2 | 8/2015 | Sprouse et al. |
| 9,116,796 | B2 | 8/2015 | Sprouse et al. |
| 9,384,126 | B1 | 7/2016 | Sprouse et al. |
| 9,730,735 | B2 | 8/2017 | Mishra et al. |
| 9,887,240 | B2 | 2/2018 | Shimabukuro et al. |
| 10,127,150 | B2 | 11/2018 | Sprouse et al. |
| 10,459,724 | B2 | 10/2019 | Yu et al. |
| 10,535,391 | B2 | 1/2020 | Osada et al. |
| 2014/0133228 | A1 | 5/2014 | Sprouse et al. |
| 2014/0133233 | A1 | 5/2014 | Li et al. |
| 2014/0133237 | A1 | 5/2014 | Sprouse et al. |
| 2014/0136756 | A1 | 5/2014 | Sprouse et al. |
| 2014/0136757 | A1 | 5/2014 | Sprouse et al. |
| 2014/0136758 | A1 | 5/2014 | Sprouse et al. |
| 2014/0136760 | A1 | 5/2014 | Sprouse et al. |
| 2014/0136762 | A1 | 5/2014 | Li et al. |
| 2014/0136763 | A1 | 5/2014 | Li et al. |
| 2014/0136764 | A1 | 5/2014 | Li et al. |
| 2014/0156576 | A1 | 6/2014 | Nugent |
| 2014/0136761 | A1 | 7/2014 | Li et al. |
| 2014/0294272 | A1 | 10/2014 | Madhabushi et al. |
| 2015/0324691 | A1 | 11/2015 | Dropps et al. |
| 2016/0026912 | A1 | 1/2016 | Falcon et al. |
| 2017/0098156 | A1 | 4/2017 | Nino et al. |
| 2017/0228637 | A1 | 8/2017 | Santoro et al. |
| 2018/0039886 | A1 | 2/2018 | Umuroglu et al. |
| 2018/0046897 | A1* | 2/2018 | Kang ............... G06N 3/0445 |
| 2018/0046901 | A1* | 2/2018 | Xie ................. G06N 3/0445 |
| 2018/0075339 | A1 | 3/2018 | Ma et al. |
| 2018/0144240 | A1 | 5/2018 | Garbin et al. |
| 2019/0057300 | A1* | 2/2019 | Mathuriya ......... G06F 3/0683 |
| 2019/0251425 | A1 | 8/2019 | Jaffari et al. |
| 2021/0073995 | A1* | 3/2021 | Yang ................ G06N 3/0481 |

OTHER PUBLICATIONS

Zamboni, Prof. Maurizio, et al., "In-Memory Binary Neural Networks," Master's Thesis, Master's Degree in Electronic Engineering, Politecnico Di Torino, Apr. 10, 2019, 327 pages.

Natsui, Masanori, et al., "Design of an energy-efficient XNOR gate based on MTJ-based nonvolatile logic-in-memory architecture for binary neural network hardware," Japanese Journal of Applied Physics 58, Feb. 2019, 8 pages.

Rastegari, Mohammad et al., "XNOR-Net: ImageNet Classification Using Binary Convolutional Neural Networks," proceedings ECCV 2016, Aug. 2016, 55 pages.

Wan, Diwen, et al., "TBN: Convolutional Neural Network with Ternary Inputs and Binary Weights," ECCV 2018, Oct. 2018, 18 pages.

Chen, Yu-Hsin, et al., "Eyeriss: An Energy-Efficient Reconfigurable Accelerator for Deep Convolutional Neural Networks," IEEE Journal of Solid-State Circuits, Feb. 2016, 12 pages.

Sun, Xiaoyu, et al., "Fully Parallel RRAM Synaptic Array for Implementing Binary Neural Network with (+1,−1) Weights and (+1, 0) Neurons," 23rd Asia and South Pacific Design Automation Conference, Jan. 2018, 6 pages. Gonugondla, Sujan K., et al., "Energy-Efficient Deep In-memory Architecture for NAND Flash Memories," IEEE International Symposium on Circuits and Systems (ISCAS), May 2018, 5 pages.

Gonugondla, Sujan K., et al., "Energy-Efficient Deep In-memory Architecture for NAND Flash Memories," IEEE International Symposium on Circuits and Systems (ISCAS), May 2018, 5 pages.

Nakahara, Hiroki, et al., "A Memory-Based Realization of a Binarized Deep Convolutional Neural Network," International Conference on Field-Programmable Technology (FPT), Dec. 2016, 4 pages.

Takeuchi, Ken, "Data-Aware NAND Flash Memory for Intelligent Computing with Deep Neural Network," IEEE International Electron Devices Meeting (IEDM), Dec. 2017, 4 pages.

Mochida, Reiji, et al., "A4M Synapses integrated Analog ReRAM based 66.5 TOPS/W Neural-Network Processor with Cell Current Controlled Writing and Flexible Network Architecture," Symposium on VLSI Technology Digest of Technical Papers, Jun. 2018, 2 pages.

Chiu, Pi-Feng, et al., "A Differential 2R Crosspoint RRAM Array With Zero Standby Current," IEEE Transactions on Circuits and Systems—II: Express Briefs, vol. 62, No. 5, May 2015, 5 pages.

Chen, Wei-Hao, et al., "A 65nm 1Mb Nonvolatile Computing-in-Memory ReRAM Macro with Sub-16ns Mulitply-and-Accumulate for Binary DNN AI Edge Processors," IEEE International Solid-State Circuits Conference, Feb. 2018, 3 pages.

Liu, Rui, et al., "Parallelizing SRAM Arrays with Customized Bit-Cell for Binary Neural Networks," DAC '18, Jun. 2018, 6 pages.

Courbariaux, Matthieu, et al., "Binarized Neural Networks: Training Neural Networks with Weights and Activations Constrained to +1 or- −1," arXiv.org, Mar. 2016, 11 pages.

Simon, Noah, et al., "A Sparse-Group Lasso," Journal of Computational and Graphical Statistics, vol. 22, No. 2, pp. 231-245, downloaded by Moskow State Univ. Bibliote on Jan. 28, 2014.

CS231n Convolutional Neural Networks for Visual Recognition, [cs231.github.io/neural-networks-2/#reg], downloaded on Oct. 15, 2019, pp. 1-15.

Krizhevsky, Alex, et al., "ImageNet Classification with Deep Convolutional Neural Networks," [http://code.google.com/p/cuda-convnet/], downloaded on Oct. 15, 2019, 9 pages.

Shafiee, Ali, et al., "ISAAC: A Convolutional Neural Network Accelerator with In-Situ Analog Arithmetic in Crossbars," ACM/IEEE 43rd Annual International Symposium on Computer Architecture (ISCA), Oct. 5, 2016, 13 pages.

Han, Song, et al., "Learning both Weights and Connections for Efficient Neural Networks," Conference paper, NIPS, Oct. 2015, 9 pages.

Jia, Yangqing, "Learning Semantic Image Representations at a Large Scale," Electrical Engineering and CS, University of Berkeley, Technical Report No. UCB/EECS-2014-93, May 16, 2014, 104 pages.

Wen, Wei, et al., "Learning Structured Sparsity in Deep Neural Networks," 30th Conference on Neural Information Processing Systems (NIPS 2016), Nov. 2016, 9 pages.

Wang, Peiqi, et al., "SNrram: An Efficient Sparse Neural Network Computation Architecture Based on Resistive Random-Access Memory," DAC '18, Jun. 24-29, 2018, 6 pages.

Zheng, Shixuan, et al., "An Efficient Kernel Transformation Architecture for Binary-and Ternary-Weight Neural Network Inference," DAC 18, Jun. 24-29, 2018, 6 pages.

Chung, Junyoung, et al., "Empirical Evaluation of Gated Recurrent Neural Networks on Sequence Modeling," [arXiv.org > cs > arXiv:1412.3555], Dec. 11, 2014, 9 pages.

Han, Song, et al., "EIE: Efficient Inference Engine on Compressed Deep Neural Network," ACM/IEEE 43rd Annual International Symposium on Computer Architecture, May 2016, 12 pages.

Han, Song, et al., "ESE: Efficient Speech Recognition Engine with Sparse LSTM on FPGA," [arXiv.org > cs > arXiv:1612.00694], Feb. 20, 2017, 10 pages.

Gokmen, Tayfun, et al., "Training LSTM Networks with Resistive Cross-Point Devices," IBM Research AI, May 2018, 17 pages.

Long, Yun, et al., "ReRAM-Based Processing-in-Memory Architecture for Recurrent Neural Network Acceleration," IEEE Transactions on Very Large Scale Integration (VLSI) Systems, vol. 26, No. 12, Dec. 2018, 14 pages.

Bengio, Yoshua, et al., "Estimating or Propagating Gradients Through Stochastic Neurons for Conditional Computation," [arXiv.org > cs > arXiv:1308.3432], Aug. 15, 2013, 12 pages.

(56) References Cited

OTHER PUBLICATIONS

Ma, Wen, et al., "Non-Volatile Memory Array Based Quantization- and Noise-Resilient LSTM Neural Networks," IEEE International Conference on Rebooting Computing (ICRC), Nov. 2019, 9 pages.

Cho, Kyunghyun, et al., "Learning Phrase Representations using RNN Encoder-Decoder for Statistical Machine Translation," [arXiv.org > cs > arXiv:1406 1078], Sep. 3, 2014, 15 pages.

Hochreiter, Sepp, et al., "Long Short-Term Memory," Neural Computation, vol. 9, Issue 8, Nov. 1997, 32 pages.

* cited by examiner

US 11,568,228 B2

RECURRENT NEURAL NETWORK INFERENCE ENGINE WITH GATED RECURRENT UNIT CELL AND NON-VOLATILE MEMORY ARRAYS

BACKGROUND

Artificial neural networks are finding increasing usage in artificial intelligence and machine learning applications. In an artificial neural network, a set of inputs is propagated through one or more intermediate, or hidden, layers to generate an output. The layers connecting the input to the output are connected by sets of weights that are generated in a training or learning phase by determining a set of a mathematical manipulations to turn the input into the output, moving through the layers calculating the probability of each output. Once the weights are established, they can be used in the inference phase to determine the output from a se of inputs. Although such neural networks can provide highly accurate results, they are extremely computationally intensive, and the data transfers involved in reading the weights connecting the different layers out of memory and transferring them into the processing units of a processing unit can be quite intensive.

BRIEF DESCRIPTION OF THE DRAWING

Like-numbered elements refer to common components in the different figures.

DETAILED DESCRIPTION

To reduce the amount of data transfer needed to perform inferencing operations for a recurrent neural network, or RNN, techniques and memory structures are presented that allow for inferencing operations to be performed through in-array multiplications within the memory arrays of a non-volatile memory device. The embodiments presented in the following present a compute-in-memory RNN with a gated recurrent unit (GRU) cell. The GRU cell is formed of a set of three non-volatile memory arrays, such as can be formed of storage class memory. For a given cycle of the RNN, the inputs can be an external input for the current cycle and also the hidden state from the preceding cycle. These inputs are converted into analog voltages and applied to a first and a second of the memory arrays, where a corresponding first and second activation function is applied to the results of the in-array multiplications. The result of the first of the in-memory multiplication is used, along with the external input, to generate an input for an-array multiplication for the third memory array, where an activation function is applied to the results of the third in-array multiplication. The hidden state for the cycle is determined from a combination of the second and third in-array multiplications.

Figure 1:
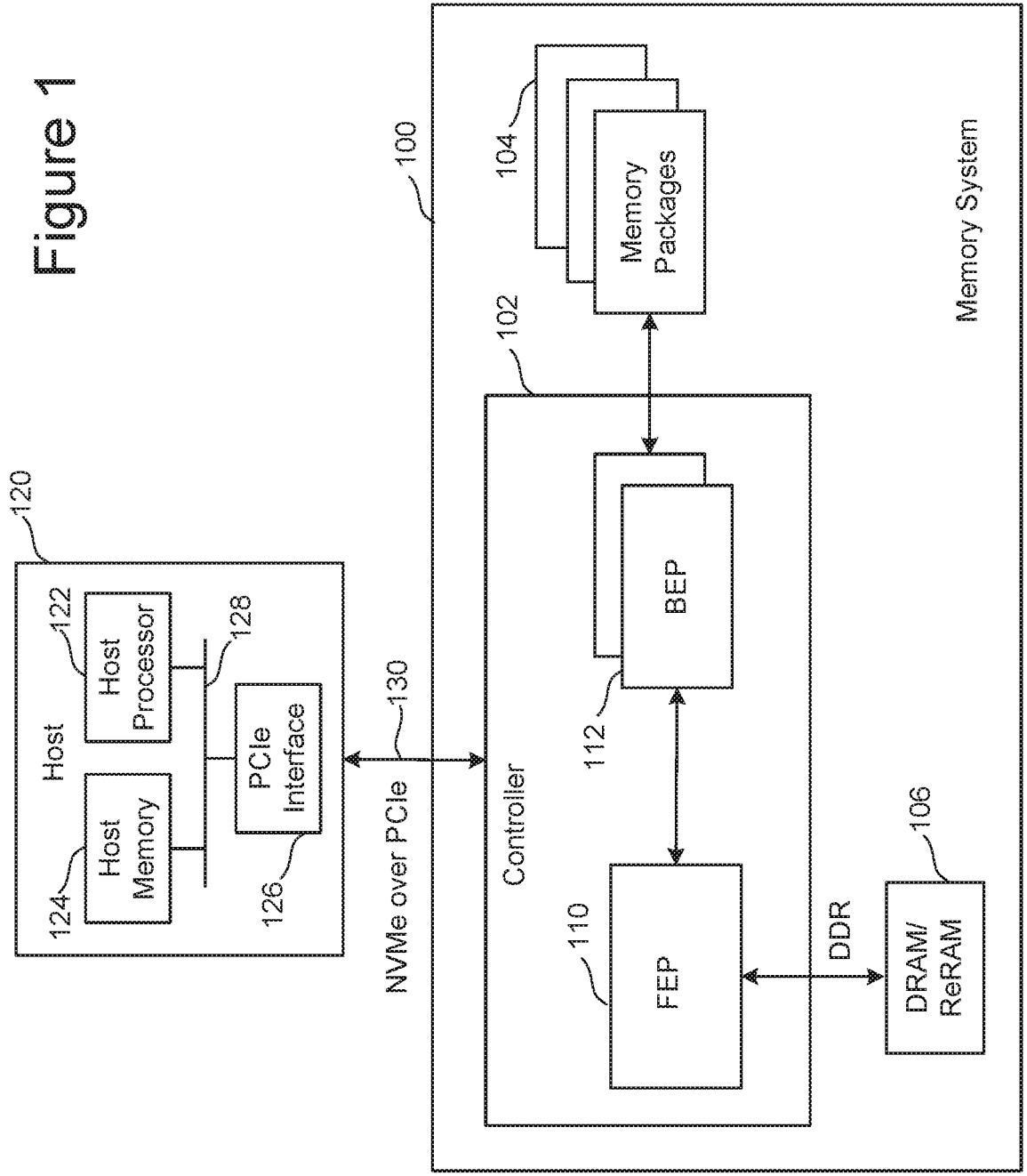
FIG. 1 is a block diagram of one embodiment of a memory system connected to a host.

FIG. 1 is a block diagram of one embodiment of a memory system 100 connected to a host 120. Memory system 100 can implement the technology proposed herein, where the neural network inputs or other data are received from the host 120. Depending on the embodiment, the inputs can be received from the host 120 and then provided to the memory packages 104 for inferencing on the weights previously programmed into the memory arrays of the memory packages 104. Many different types of memory systems can be used with the technology proposed herein. Example memory systems include solid state drives ("SSDs"), memory cards and embedded memory devices; however, other types of memory systems can also be used.

Memory system 100 of FIG. 1 comprises a controller 102, non-volatile memory 104 for storing data, and local memory (e.g. DRAM/ReRAM) 106. Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two-dimensional NAND flash memory and/or three-dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
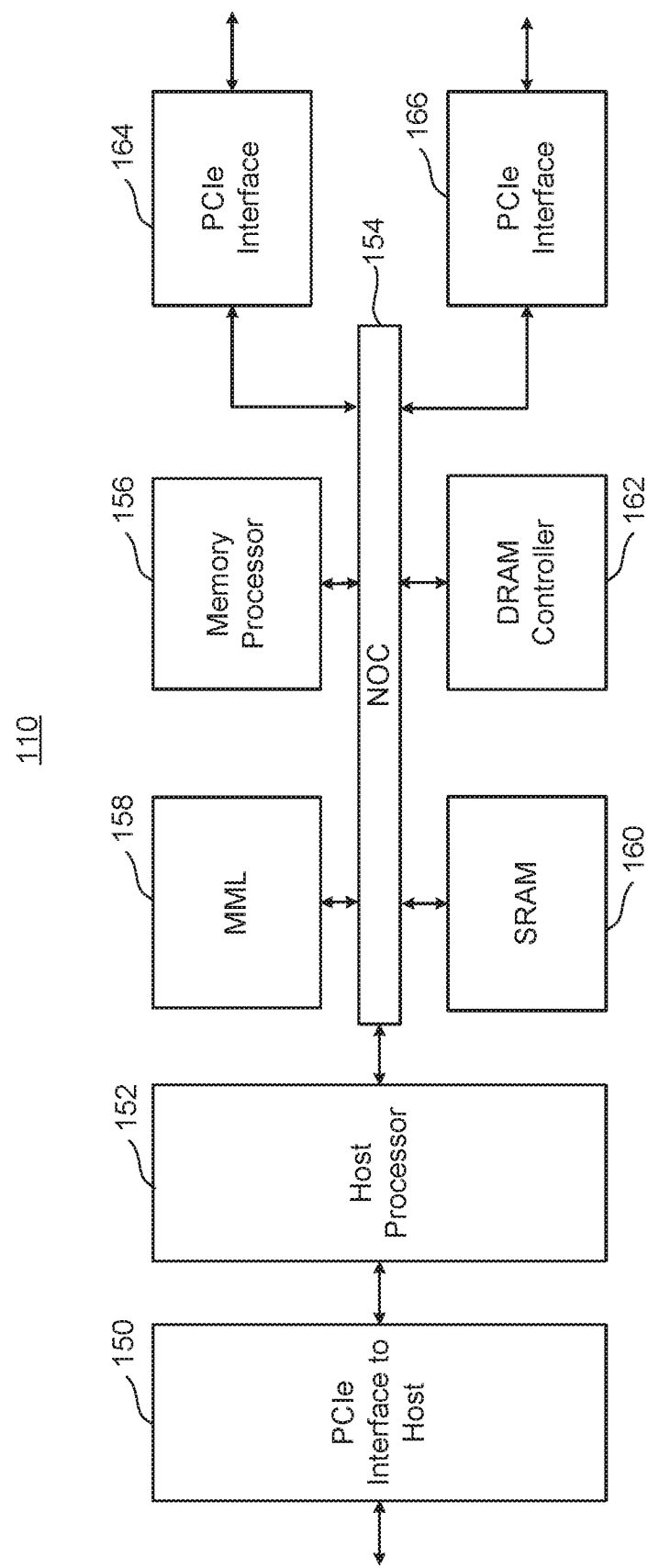
FIG. 2 is a block diagram of one embodiment of a Front End Processor Circuit. In some embodiments, the Front End Processor Circuit is part of a controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 326 of FIG. 5 below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
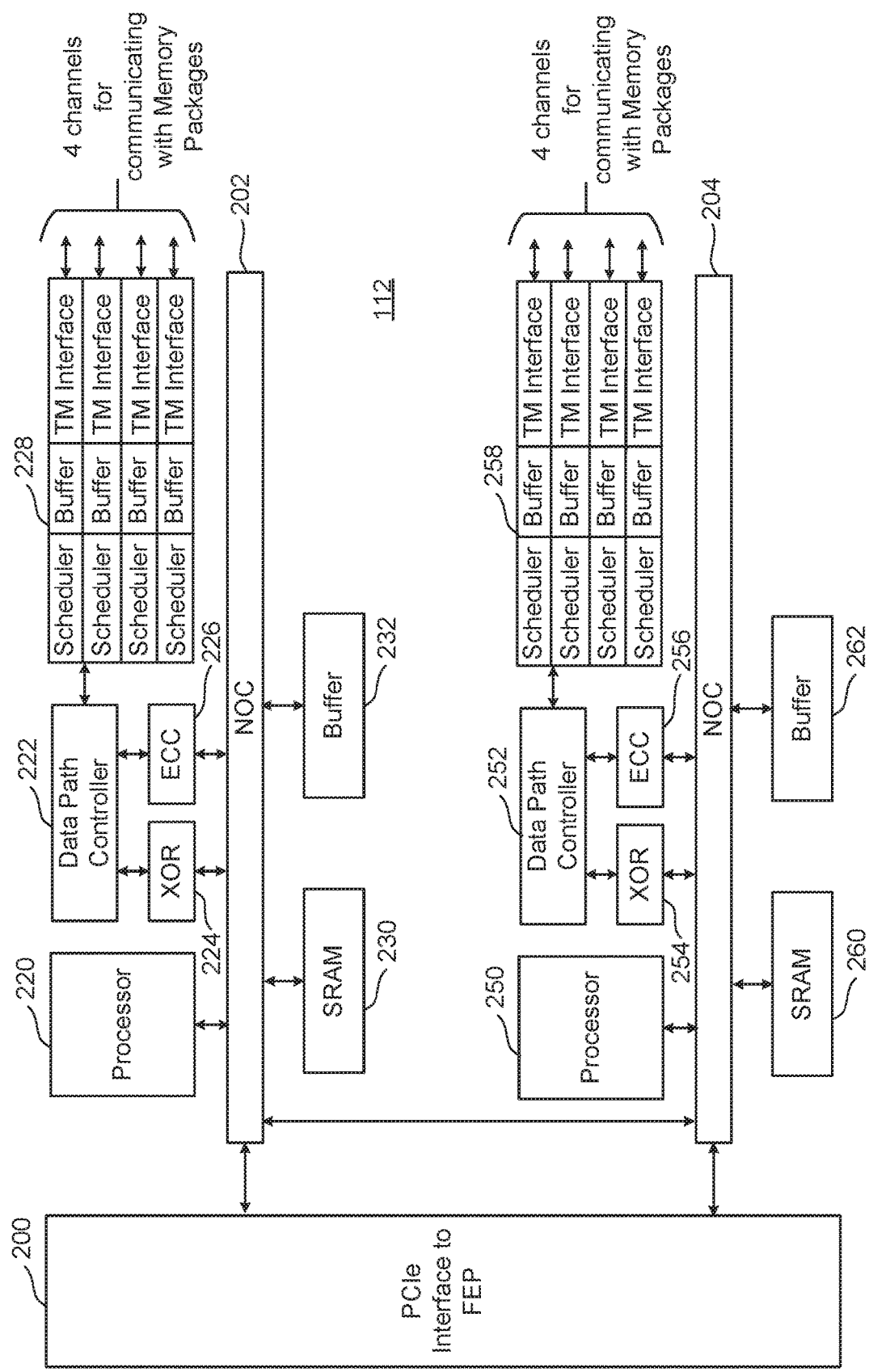
FIG. 3 is a block diagram of one embodiment of a Back End Processor Circuit. In some embodiments, the Back End Processor Circuit is part of a controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 4:
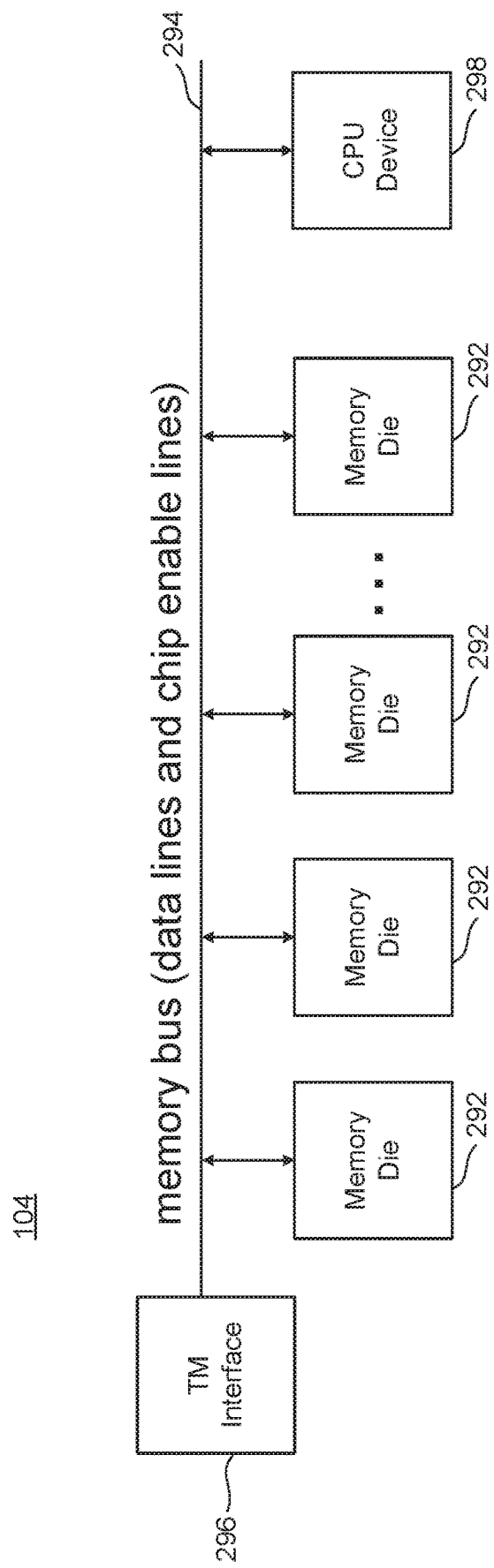
FIG. 4 is a block diagram of one embodiment of a memory package.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. In some embodiments, the memory package can also include a processor, CPU device 298, such as a RISC-V CPU along with some amount of RAM to help implement some of capabilities described below. The technology described herein is not limited to any particular number of memory die.

Figure 5:
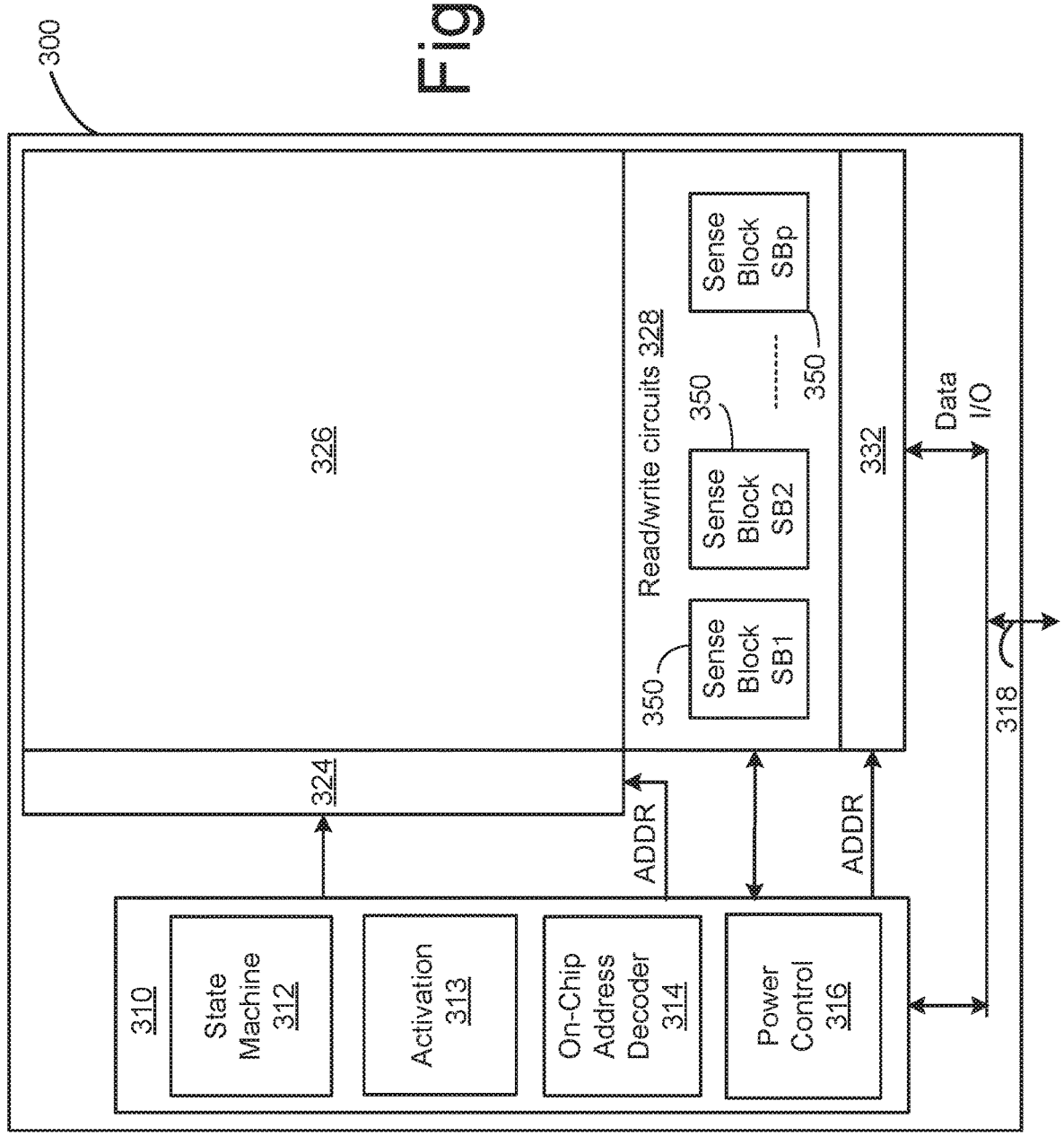
FIG. 5 is a block diagram of one embodiment of a memory die.

FIG. 5 is a functional block diagram of one embodiment of a memory die 300. The components depicted in FIG. 5 are electrical circuits. In one embodiment, each memory die 300 includes a memory structure 326, control circuitry 310, and read/write circuits 328. Memory structure 126 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells to be read or programmed in parallel. Commands and data are transferred between the controller and the memory die 300 via lines 318. In one embodiment, memory die 300 includes a set of input and/or output (I/O) pins that connect to lines 318.

Control circuitry 310 cooperates with the read/write circuits 328 to perform memory operations (e.g., write, read, and others) on memory structure 326, and includes a state machine 312, an activation logic block 313 that be used for the activation operations of neural network as described below, an on-chip address decoder 314, and a power control circuit 316. State machine 312 provides die-level control of memory operations. In one embodiment, state machine 312 is programmable by software. In other embodiments, state machine 312 does not use software and is completely implemented in hardware (e.g., electrical circuits). In another embodiment, state machine 312 is replaced by a micro-controller. In one embodiment, control circuitry 310 includes buffers such as registers, ROM fuses and other storage devices for storing default values such as base voltages and other parameters.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages. The sense blocks include bit line drivers.

For purposes of this document, the phrase "one or more control circuits" refers to a controller, a state machine, a micro-controller and/or control circuitry 310, or other analogous circuits that are used to control non-volatile memory.

In one embodiment, memory structure 326 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 326 comprises a two-dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave.

The elements of FIG. 5 can be grouped into two parts, the memory structure 326 of the memory cells and the peripheral circuitry, including all of the other elements. An important characteristic of a memory circuit is its capacity, which can be increased by increasing the relative area of the memory die 300 that is given over to the memory structure 326; however, this reduces the area of the memory die 300 available for the peripheral circuitry. This can place quite serve restrictions on these peripheral elements. For example, the need to fit sense amplifier circuits within the available area can be a significant restriction on sense amplifier design architectures. With respect to the on-die control circuitry 310, reduced availability of area can limit the available functionalities that can be implemented on-chip. Consequently, a basic trade-off in the design of a memory die 300 is amount of area to devote to the memory structure 326 and the amount of area to devote to the peripheral circuitry.

Another area in which the memory structure 326 and the peripheral circuitry are often at odds is in the processing involved in forming these regions. Since these regions often involve differing processing technologies, there will be a trade-off in having differing technologies on a single die. For example, when the memory structure 326 is NAND flash, this is an NMOS structure, while the peripheral circuitry is often CMOS based. Sense amplifier circuits in the sense blocks 350, charge pumps in the power control block 316, logic elements in the state machine 312, and other peripheral circuitry often employ PMOS devices. Processing operations optimized for manufacturing a CMOS die will differ in many aspects from the processing operations optimized for an NMOS flash NAND memory or other memory cell technologies.

To improve upon these limitations, embodiments described below can separate the elements of FIG. 5 onto separately formed dies that are then bonded together. More specifically, the memory structure 326 can be formed on one die and some or all of the peripheral circuitry elements, including one or more control circuits, can be formed on a separate die. For example, a memory die can be formed of just the memory elements, such as the array of memory cells of flash NAND memory, a PCM memory, a ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 6A:
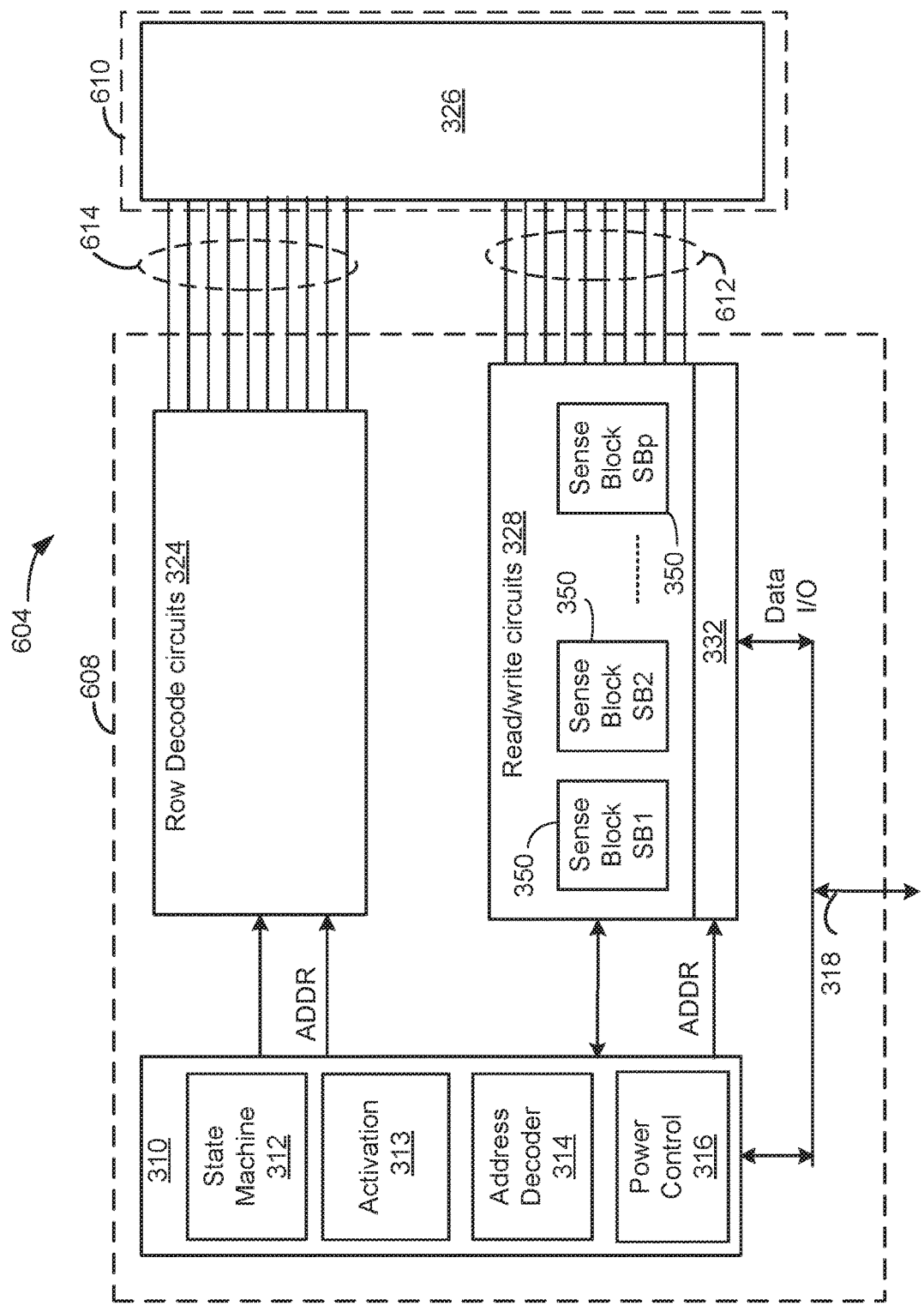
FIGS. 6A and 6B show an alternative arrangement to the arrangement of FIG. 5, which may be implemented using wafer-to-wafer bonding to provide a bonded die pair.
Figure 6B:
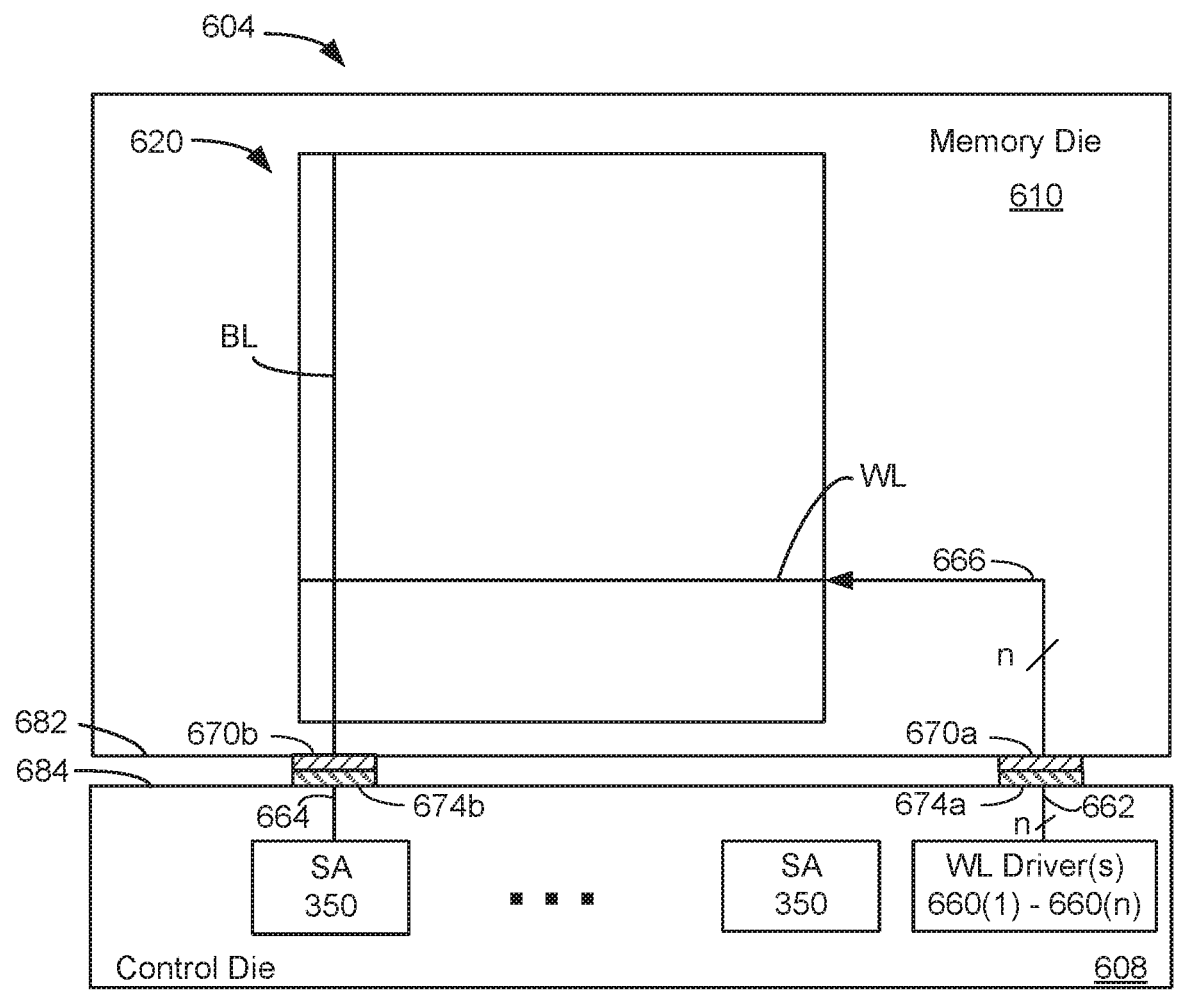

FIGS. 6A and 6B show an alternative arrangement to the arrangement of FIG. 5, which may be implemented using wafer-to-wafer bonding to provide a bonded die pair 604. FIG. 6A shows an example of the peripheral circuitry, including control circuits, formed in a peripheral circuit or control die 608 coupled to memory structure 326 formed in the memory die 610. Common components are numbered as in FIG. 5. It can be seen that control circuitry 310, read/write circuits 328, and row decoder 324 (which may be formed by a CMOS process) are located in control die 608. Additional elements, such as functionalities from controller 102 can also be moved into the control die 608. Control circuitry 310, read/write circuits 328, row decoder 324, and column decoder 332 may be formed by a common process (e.g. CMOS process), so that adding elements and functionalities more typically found on a memory controller 102 may require few or no additional process steps (i.e. the same process steps used to fabricate controller 102 may also be used to fabricate control circuitry 310, read/write circuits 328, and row decoder 324). Thus, while moving such circuits from a die such as memory die 300 may reduce the number of steps needed to fabricate such a die, adding such circuits to a die such as control die 608 may not require any additional process steps.

FIG. 6A shows read/write circuits 328 on the control die 608 coupled to memory structure 326 on the memory die 610 through electrical paths 612. For example, electrical paths 612 may provide electrical connection between read/write circuits 328 and bit lines of memory structure 326. Electrical paths may extend from read/write circuits 328 in control die 608 through pads on control die 608 that are bonded to corresponding pads of the memory die 610, which are connected to bit lines of memory structure 326. Each bit line of memory structure 326 may have a corresponding electrical path in electrical paths 612, including a pair of bonded pads, that connects to read/write circuits 328. Similarly, row decoder circuits 324 are coupled to memory structure 326 through electrical paths 614. Each of electrical path 614 may correspond to a word line, dummy word line, or select gate line. Additional electrical paths may also be provided between control die 608 and memory die 610.

FIG. 6B is a block diagram showing more detail on the arrangement of one embodiment of the integrated memory assembly of bonded die pair 604. Memory die 610 contains a plane 620 or array of memory cells. The memory die 610 may have additional planes or arrays. One representative bit line (BL) and representative word line (WL) is depicted for each plane or array 620. There may be thousands or tens of thousands of such bit lines per each plane or array 620. In one embodiment, an array or plane represents a groups of connected memory cells that share a common set of unbroken word lines and unbroken bit lines.

Control die 608 includes a number of sense amplifiers (SA) 350. Each sense amplifier 350 is connected to one bit line or may be connected to multiple bit lines in some embodiments. The sense amplifier contains a bit line driver. Thus, the sense amplifier may provide a voltage to the bit line to which it is connected. The sense amplifier is configured to sense a condition of the bit line. In one embodiment, the sense amplifier is configured to sense a current that flows in the bit line. In one embodiment, the sense amplifier is configured to sense a voltage on the bit line.

The control die 608 includes a number of word line drivers 660(1)-660(n). The word line drivers 660 are configured to provide voltages to word lines. In this example, there are "n" word lines per array or plane memory cells. If the memory operation is a program or read, one word line within the selected block is selected for the memory operation, in one embodiment. If the memory operation is an erase, all of the word lines within the selected block are selected for the erase, in one embodiment. The word line drivers 660 (e.g. part of Power Control 316) provide voltages to the word lines in memory die 610. As discussed above with respect to FIG. 6A, the control die 608 may also include charge pumps, voltage generators, and the like that are not represented in FIG. 6B, which may be used to provide voltages for the word line drivers 660 and/or the bit line drivers.

The memory die 610 has a number of bond pads 670a, 670b on a first major surface 682 of memory die 610. There may be "n" bond pads 670a, to receive voltages from a corresponding "n" word line drivers 660(1)-660(n). There may be one bond pad 670b for each bit line associated with plane 620. The reference numeral 670 will be used to refer in general to bond pads on major surface 682.

In some embodiments, each data bit and each parity bit of a codeword are transferred through a different bond pad pair 670b, 674b. The bits of the codeword may be transferred in parallel over the bond pad pairs 670b, 674b. This provides for a very efficient data transfer relative to, for example, transferring data between the memory controller 102 and the integrated memory assembly 604. For example, the data bus between the memory controller 102 and the integrated memory assembly 604 may, for example, provide for eight, sixteen, or perhaps 32 bits to be transferred in parallel. However, the data bus between the memory controller 102 and the integrated memory assembly 604 is not limited to these examples.

The control die 608 has a number of bond pads 674a, 674b on a first major surface 684 of control die 608. There may be "n" bond pads 674a, to deliver voltages from a corresponding "n" word line drivers 660(1)-660(n) to memory die 610. There may be one bond pad 674b for each bit line associated with plane 620. The reference numeral 674 will be used to refer in general to bond pads on major surface 682. Note that there may be bond pad pairs 670a/674a and bond pad pairs 670b/674b. In some embodiments, bond pads 670 and/or 674 are flip-chip bond pads.

In one embodiment, the pattern of bond pads 670 matches the pattern of bond pads 674. Bond pads 670 are bonded (e.g., flip chip bonded) to bond pads 674. Thus, the bond pads 670, 674 electrically and physically couple the memory die 610 to the control die 608.

Also, the bond pads 670, 674 permit internal signal transfer between the memory die 610 and the control die 608. Thus, the memory die 610 and the control die 608 are bonded together with bond pads. Although FIG. 5A depicts one control die 608 bonded to one memory die 610, in another embodiment one control die 608 is bonded to multiple memory dies 610.

Herein, "internal signal transfer" means signal transfer between the control die 608 and the memory die 610. The internal signal transfer permits the circuitry on the control die 608 to control memory operations in the memory die 610. Therefore, the bond pads 670, 674 may be used for memory operation signal transfer. Herein, "memory operation signal transfer" refers to any signals that pertain to a memory operation in a memory die 610. A memory operation signal transfer could include, but is not limited to, providing a voltage, providing a current, receiving a voltage, receiving a current, sensing a voltage, and/or sensing a current.

The bond pads 670, 674 may be formed for example of copper, aluminum and alloys thereof. There may be a liner between the bond pads 670, 674 and the major surfaces (682, 684). The liner may be formed for example of a titanium/titanium nitride stack. The bond pads 670, 674 and liner may be applied by vapor deposition and/or plating techniques. The bond pads and liners together may have a thickness of 720 nm, though this thickness may be larger or smaller in further embodiments.

Metal interconnects and/or vias may be used to electrically connect various elements in the dies to the bond pads 670, 674. Several conductive pathways, which may be implemented with metal interconnects and/or vias are depicted. For example, a sense amplifier 350 may be electrically connected to bond pad 674b by pathway 664. Relative to FIG. 6A, the electrical paths 612 can correspond to pathway 664, bond pads 674b, and bond pads 670b. There may be thousands of such sense amplifiers, pathways, and bond pads. Note that the BL does not necessarily make direct connection to bond pad 670b. The word line drivers 660 may be electrically connected to bond pads 674a by pathways 662. Relative to FIG. 6A, the electrical paths 614 can correspond to the pathway 662, the bond pads 674a, and bond pads 670a. Note that pathways 662 may comprise a separate conductive pathway for each word line driver 660(1)-660(n). Likewise, a there may be a separate bond pad 674a for each word line driver 660(1)-660(n). The word lines in block 2 of the memory die 610 may be electrically connected to bond pads 670a by pathways 664. In FIG. 6B, there are "n" pathways 664, for a corresponding "n" word lines in a block. There may be separate pair of bond pads 670a, 674a for each pathway 664.

Relative to FIG. 5, the on-die control circuits of FIG. 6A can also include addition functionalities within its logic elements, both more general capabilities than are typically found in the memory controller 102 and some CPU capabilities, but also application specific features. In some of the embodiments described below, this can include a wide range of activation functions, which determine the amplitude of the output, for use in the neural network operations described in the following and as represented at the activation logic block 313 of the on-die control circuit. For example, these activation functions can include addition and threshold determination operations used in the accumulation portion of Multiple and ACcumulation (MAC) operations, but more advanced operations such as sigmoid or tan h (hyperbolic tangent) functions.

In the following, state machine 312 and/or controller 102 (or equivalently functioned circuits), in combination with all or a subset of the other circuits depicted on the control die 608 in FIG. 6A and similar elements in FIG. 5, can be considered part of the one or more control circuits that perform the functions described herein. The control circuits can include hardware only or a combination of hardware and software (including firmware). For example, a controller programmed by firmware to perform the functions described herein is one example of a control circuit. A control circuit can include a processor, FGA, ASIC, integrated circuit or other type of circuit.

Turning now to types of data that can be stored on non-volatile memory devices, a particular example of the type of data of interest in the following discussion is the weights used is in artificial neural networks, such as convolutional neural networks or CNNs. The name "convolutional neural network" indicates that the network employs a mathematical operation called convolution, that is a specialized kind of linear operation. Convolutional networks are neural networks that use convolution in place of general matrix multiplication in at least one of their layers. A CNN is formed of an input and an output layer, with a number of intermediate hidden layers. The hidden layers of a CNN are typically a series of convolutional layers that "convolve" with a multiplication or other dot product.

Each neuron in a neural network computes an output value by applying a specific function to the input values coming from the receptive field in the previous layer. The function that is applied to the input values is determined by a vector of weights and a bias. Learning, in a neural network, progresses by making iterative adjustments to these biases and weights. The vector of weights and the bias are called filters and represent particular features of the input (e.g., a particular shape). A distinguishing feature of CNNs is that many neurons can share the same filter.

Figure 7:
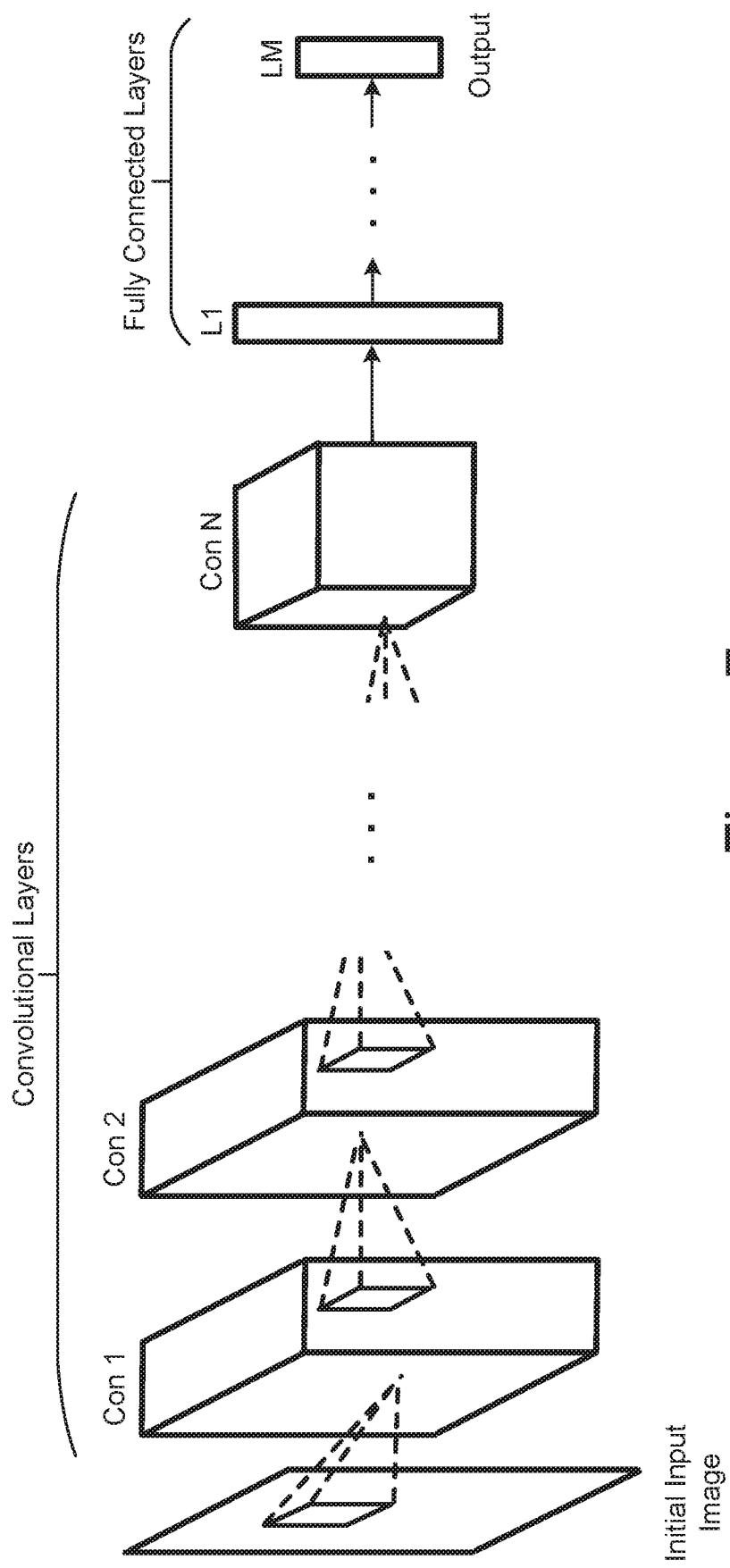
FIG. 7 is a schematic representation of an example of a convolutional neural network (CNN).

FIG. 7 is a schematic representation of an example of a CNN. FIG. 7 illustrates an initial input image of an array of pixel values, followed by a number convolutional layers that are in turn followed by a number of fully connected layers, the last of which provides the output. Each neuron in the first convolutional layer (Con 1) takes as input data from an n×n pixel sub-region of the input image. The neuron's learned weights, which are collectively referred to as its convolution filter, determine the neuron's single-valued output in response to the input. In the convolutional layers, a neuron's filter is applied to the input image by sliding the input region along the image's x and y dimensions to generate the values of the convolutional layer. In practice, the equivalent convolution is normally implemented by statically identical copies of the neuron to different input regions. The process is repeated through each of the convolutional layers (Coni to Con N) using each layer's learned weights, after which it is propagated through the fully connected layers (L1 to LM) using their learned weights.

Figure 8:
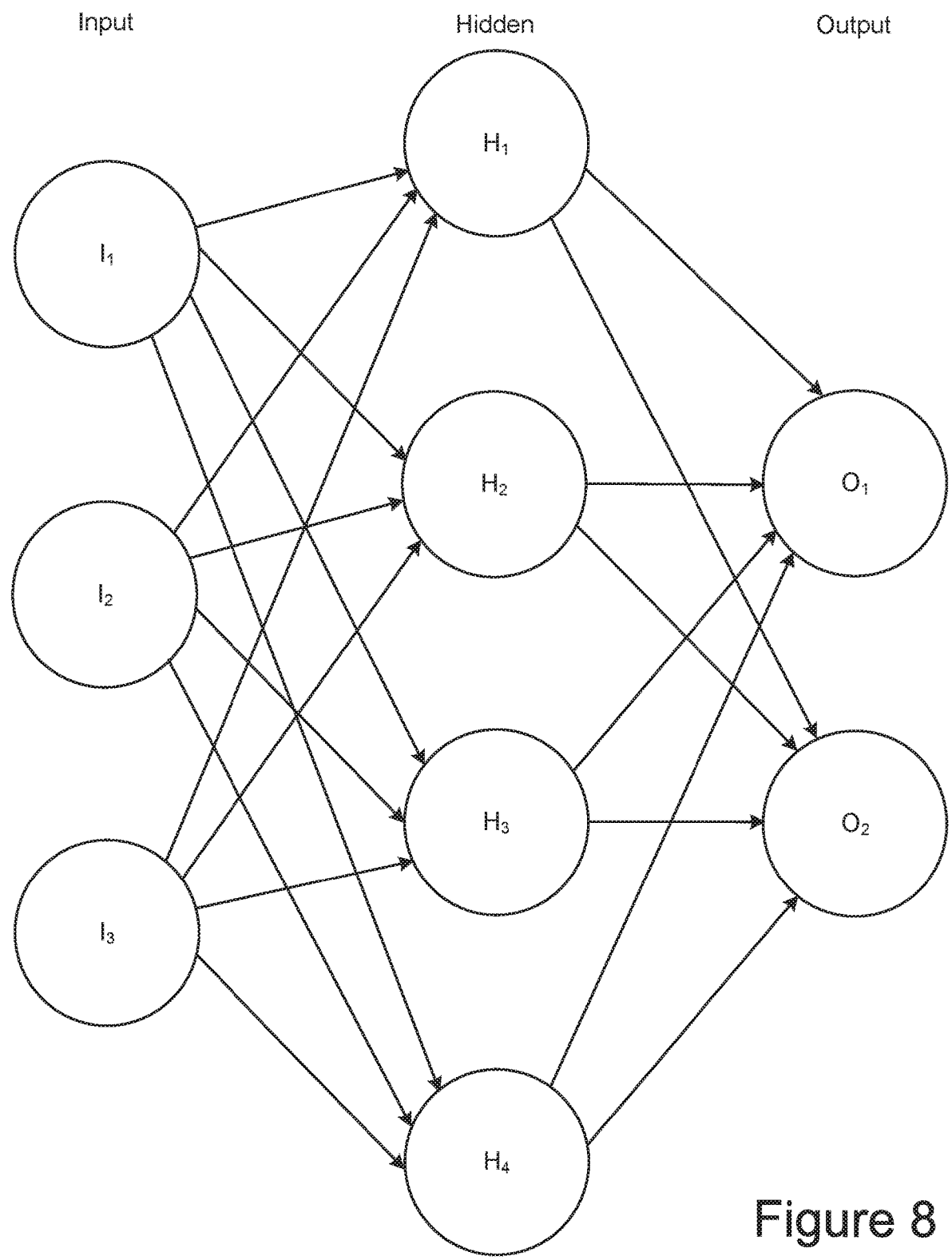
FIG. 8 represents several fully connected layers of a neural network in more detail.

FIG. 8 represents several fully connected layers of a neural network in more detail. In FIG. 8, the shown three layers of the artificial neural network are represented as an interconnected group of nodes or artificial neurons, represented by the circles, and a set of connections from the output of one artificial neuron to the input of another. The example shows three input nodes ($I_1$, $I_2$, $I_3$) and two output nodes ($O_1$, $O_2$), with an intermediate layer of four hidden or intermediate nodes ($H_1$, $H_2$, $H_3$, $H_4$). The nodes, or artificial neurons/synapses, of the artificial neural network are implemented by logic elements of a host or other processing system as a mathematical function that receives one or more inputs and sums them to produce an output. Usually each input is separately weighted and the sum is passed through the node's mathematical function to provide the node's output.

In common artificial neural network implementations, the signal at a connection between nodes (artificial neurons/synapses) is a real number, and the output of each artificial neuron is computed by some non-linear function of the sum of its inputs. Nodes and their connections typically have a weight that adjusts as a learning process proceeds. The weight increases or decreases the strength of the signal at a connection. Nodes may have a threshold such that the signal is only sent if the aggregate signal crosses that threshold. Typically, the nodes are aggregated into layers. Different layers may perform different kinds of transformations on their inputs. Signals travel from the first layer (the input layer), to the last layer (the output layer), possibly after traversing the layers multiple times. Although FIG. 8 shows only a single intermediate or hidden layer, a complex deep neural network (DNN) can have many such intermediate layers.

As mentioned above, another type of neural network is a Recurrent Neural Network, or RNN. An RNN is a type of sequential network in which current a hidden state $h_t$ is derived from a current external input $x_t$ and the previous hidden state by applying an activation function to current input and the previous hidden state. In an RNN, the same sets of weights are used each layer of the network, as illustrated in FIG. 9.

Figure 9:
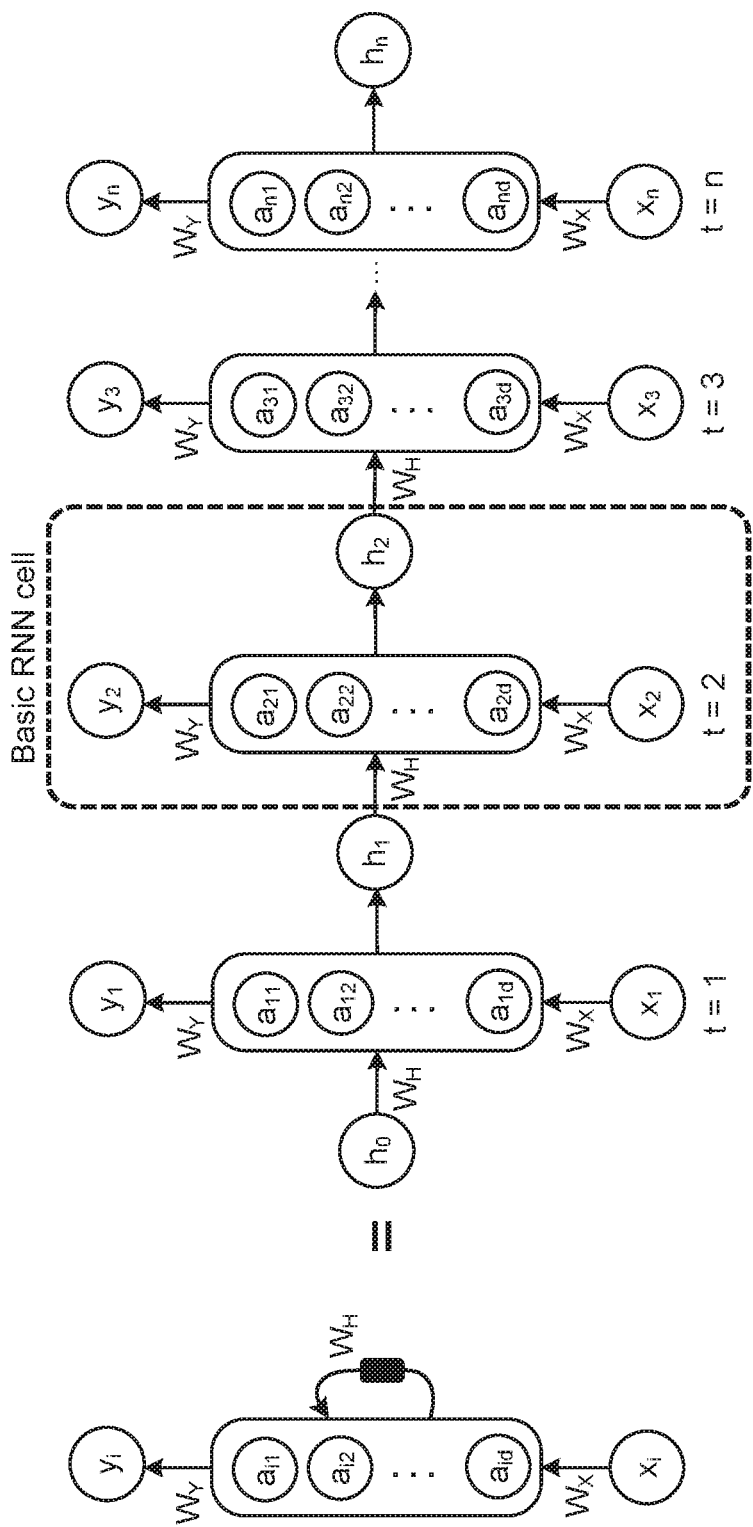
FIG. 9 is a schematic representation of a Recurrent Neural Network (RNN), both in a simplified representation to highlight the recurrent nature of the network, and in an expanded form.

FIG. 9 is a schematic representation of an RNN, both in a simplified form to highlight the recurrent nature of the network, and in an expanded form. As shown in the schematic representation to the left, an RNN has a number of hidden nodes $a_{ij}$, where i is the stage of the network and j runs from 1 to the dimension d of the number of internal nodes. At each stage, an input $x_t$ can be input into the RNN through a set of weights $W_X$. At each stage, an output, or yielding result, $y_t$ through a set of weights $W_Y$. The hidden output of one layer, $h_{i-1}$ is the input to the next layer though a set of weights $W_H$. At each layer, the same set of weights is used, as illustrated schematically by the loop through $W_H$ on the left side of FIG. 9. This is illustrated by the right side of FIG. 9 that expands out the schematic representation to the left. On the right, FIG. 9 illustrates the propagation of an initial hidden input ho through n stages, t=1-n, though a set of weights $W_H$. At each stage, an input $x_t$ can be applied through the weights $W_X$ and an output $y_t$ can be provided through the weights $W_Y$. It is important to note that, at each value for t, the weights $W_X$, $W_H$, and $W_Y$ are the same, as represented by the basic RNN cell. RNNs will be discussed in more detail below.

A supervised artificial neural network is "trained" by supplying inputs and then checking and correcting the outputs. For example, a neural network that is trained to recognize dog breeds will process a set of images and calculate the probability that the dog in an image is a certain breed. A user can review the results and select which probabilities the network should display (above a certain threshold, etc.) and return the proposed label. Each mathematical manipulation as such is considered a layer, and complex neural networks have many layers. Due to the depth provided by a large number of intermediate or hidden layers, neural networks can model complex non-linear relationships as they are trained.

Figure 10B:
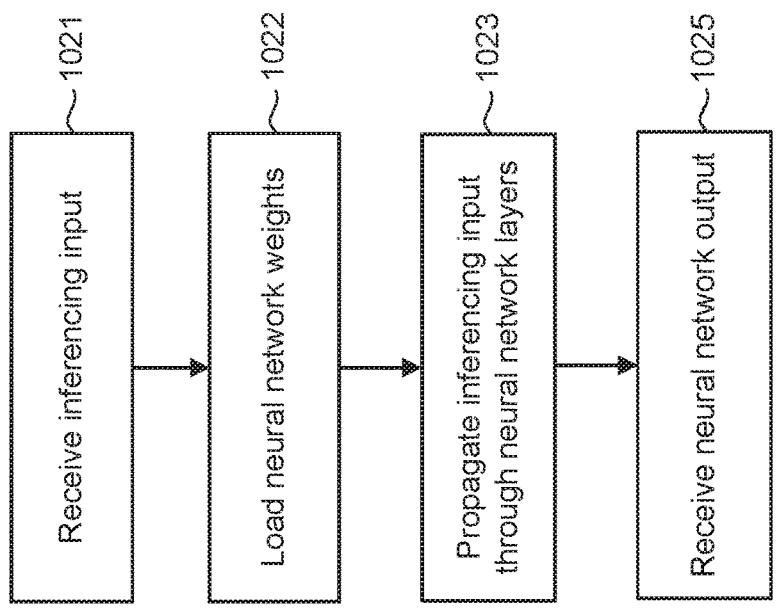
FIG. 10B is a flowchart describing one embodiment of a process for inference using a neural network.
Figure 10A:
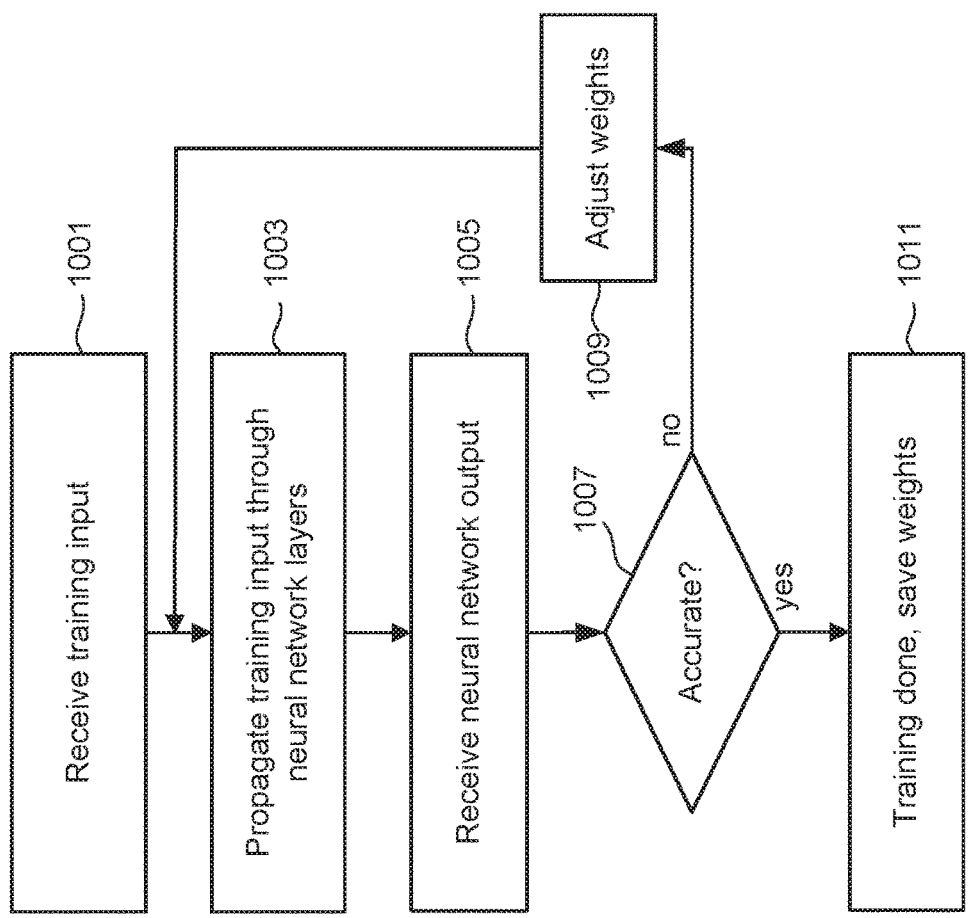
FIG. 10A is a flowchart describing one embodiment of a process for training a neural network to generate a set of weights.

FIG. 10A is a flowchart describing one embodiment of a process for training a neural network to generate a set of weights. The training process is often performed in the cloud, allowing additional or more powerful processing the accessed. At step 1001, the input, such as a set of images, is received (e.g., the image input in FIG. 7). At step 1003 the input is propagated through the layers connecting the input to the next layer (e.g., CON1 in FIG. 7 using the current filter, or set of weights. The neural network's output is then received at next layer (e.g., CON2 in in FIG. 7) in step 1005, so that the values received as output from one layer serve as the input to the next layer. The inputs from the first layer are propagated in this way through all of the intermediate or hidden layers until they reach the output. In the dog breed example of the preceding paragraph, the input would be the image data of a number of dogs, and the intermediate layers use the current weight values to calculate the probability that the dog in an image is a certain breed, with the proposed dog breed label returned at step 1005. A user can then review the results at step 1007 to select which probabilities the neural network should return and decide whether the current set of weights supply a sufficiently accurate labelling and, if so, the training is complete (step 1011). If the result is not sufficiently accurate, the neural network adjusts the weights at step 1009 based on the probabilities the user selected, followed by looping back to step 1003 to run the input data again with the adjusted weights. Once the neural network's set of weights have been determined, they can be used to "inference," which is the process of using the determined weights to generate an output result from data input into the neural network. Once the weights are determined at step 1011, they can then be stored in non-volatile memory for later use, where the storage of these weights in non-volatile memory is discussed in further detail below.

FIG. 10B is a flowchart describing a process for the inference phase of supervised learning using a neural network to predict the "meaning" of the input data using an estimated accuracy. Depending on the case, the neural network may be inferenced both in the cloud and by an edge device's (e.g., smart phone, automobile process, hardware accelerator) processor. At step 1021, the input is received, such as the image of a dog in the example used above. If the previously determined weights are not present in the device running the neural network application, they are loaded at step 1022. For example, on a host processor executing the neural network, the weight could be read out of an SSD in which they are stored and loaded into RAM on the host device. At step 1023, the input data is then propagated through the neural network's layers. Step 1023 will be similar to step 1003 of FIG. 10A, but now using the weights established at the end of the training process at step 1011. After propagating the input through the intermediate layers, the output is then provided at step 1025.

Neural networks are typically feedforward networks in which data flows from the input layer, through the intermediate layers, and to the output layer without looping back. At first, in the training phase of supervised learning as illustrated by FIG. 10A, the neural network creates a map of virtual neurons and assigns random numerical values, or "weights", to connections between them. The weights and inputs are multiplied and return an output between 0 and 1. If the network does not accurately recognize a particular pattern, an algorithm adjusts the weights. That way the algorithm can make certain parameters more influential (by increasing the corresponding weight) or less influential (by decreasing the weight) and adjust the weights accordingly until it determines a set of weights that provide a sufficiently correct mathematical manipulation to fully process the data.

Returning now to recurrent neural networks, RNNs are widely applied for a vast of applications using time-series data, such as speech recognition, sentiment classification, machine translation, and video activity recognition, among others. Referring back to FIG. 9, the inputs to the basic RNN cell at stage t are the hidden input of the preceding stage, $h_{(t-1)}$ and any new external layer input $x_t$. The value of the layer's hidden nodes at is given by:

$$a_t = W_H h_{(t-1)} + W_X x_t,$$

where $W_H$ is the set of hidden weight values for the RNN that are used on the hidden state as it propagates from layer to layer and $W_X$ is the set of input weight values used on the input to each layer. The output $h_t$ from the hidden state for stage t is:

$$h_t = \tan h(a_t),$$

where in this example an activation function of tan h is used for propagating the hidden state from layer to layer. The prediction for the output, or yielding result, $y_t$, at each layer is:

$$y_t = \text{softmax}(W_Y h_t),$$

where $W_Y$ is the set of output weight values and, in this example, a softmax function is used to generate the prediction at time t.

An important consideration for many applications of RNNs is for low power RNNs that can handle time-serial, large-scale data on system with limited power budget, such as mobile devices, internet of things (IoT) devices, and self-driving cars. Compute-in-Memory DNN (CIM-DNN) accelerators have been considered as a potential approach, since they can minimize data movement overhead leading to significant improvement on performance and energy efficiency in order to overcome system power constraints. By leveraging near-zero leakage, low read latency, and large capacity features of non-volatile memory (NVM) devices, the NVM-based CIM-DNN accelerators are potential solutions for system-on-chip integration in order to provide applications based on deep learning and/or machine leaning.

Two approaches to RNN are to replace the basic RNN cell of FIG. 9 by Long-Short Term Memory (LSTM) or Gated Recurrent Unit (GRU) cell. Relative to GRU-based implementations, the realization of LSTM-based RNN on hardware is relatively expensive in terms of non-volatile memory array size and I/O circuits (such as ADCs, DACs, element multipliers and adders). The embodiments presented below describe GRU-based compute in memory RNN architectures that have comparable prediction error, but less complexity, than LSTM-based implementations. In particular, a GRU cell can have significantly less complexity than an LSTM cell in terms of the number of required vector-matrix multiplications and non-linear activation functions.

Figure 11:
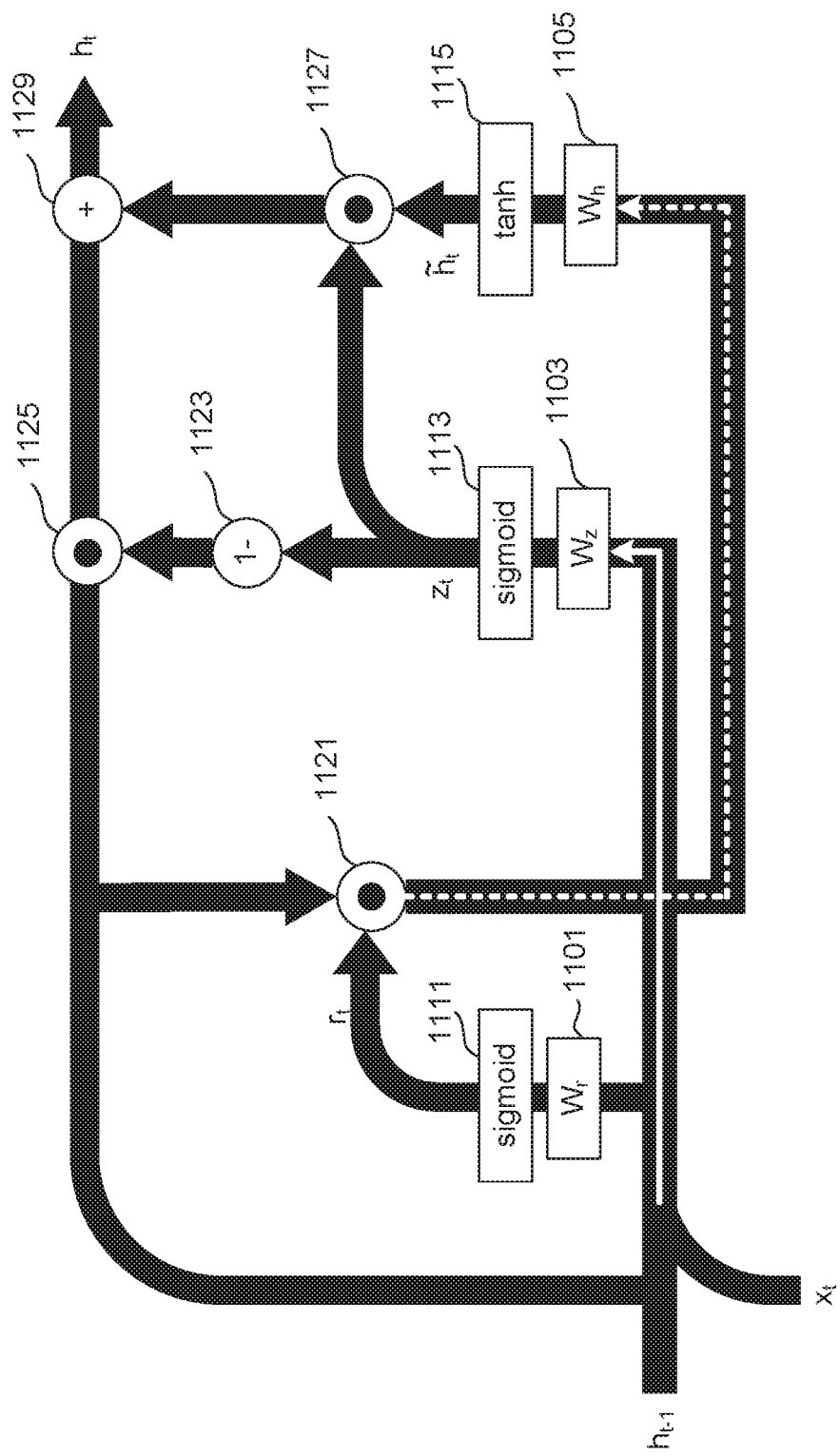
FIG. 11 is a schematic representation of the structure of a GRU cell.

FIG. 11 is a schematic representation of the structure of a GRU cell. At a time t, the output of the GRU cell will be $h_t$ and the inputs to the cell will be the current input $x_t$ and the output $h_{t-1}$ of the hidden state previous from the previous GRU cell at time (t−1). In the GRU cell, three sets of weights are used: $W_r$ 1101, $W_z$ 1103, and $W_h$ 1105. The input to each of the set of weights $W_r$ 1101 and $W_z$ 1103 is the combined vector of $[x_t, h_{t-1}]$, followed by, in this embodiment, a sigmoid activation function 1111 and 1113, respectively. The respective intermediate outputs are:

$$r_t = \text{sigmoid}([x_t, h_{t-1}] W_r), \text{ and}$$

$$z_t = \text{sigmoid}([x_t, h_{t-1}] W_z)$$

To form the input vector for the set of weights $W_h$, the first part of the vector is again $x_t$, but second part is formed from $r_t$ and $h_{t-1}$ by element-wise multiplication (represented as $\odot$) of $r_t \odot h_{t-1}$ as generated at multiplier 1121. This combined input vector is then applied to the set of weights $W_h$ 1105 followed by, in this embodiment, a tan h activation function, giving an output:

$$\tilde{h}_t = \tan h([x_t, r_t \odot h_{t-1}] W_h)$$

To form the output $h_t$, $z_t$ is (element-wise) multiplied by $\tilde{h}_t$ at 1127 and $z_t$ is subtracted from 1 at 1123, with the difference $(1-z_t)$ (element-wise) multiplied by $h_{t-1}$ at 1125. These two products are then combined in adder 1129 to generate the output:

$$h_t = (1-z_t) \odot h_{t-1} + z_t \odot \tilde{h}_t.$$

To achieve this output for the GRU cell, this requires three vector-matrix multiplications (for the three sets of weights) and three non-linear activations (the sigmoid and tan h functions). This is a lower level of complexity that for an LTSM cell, which has four sets of weights and uses four vector-matrix multiplications and five non-linear activations.

Figure 12:
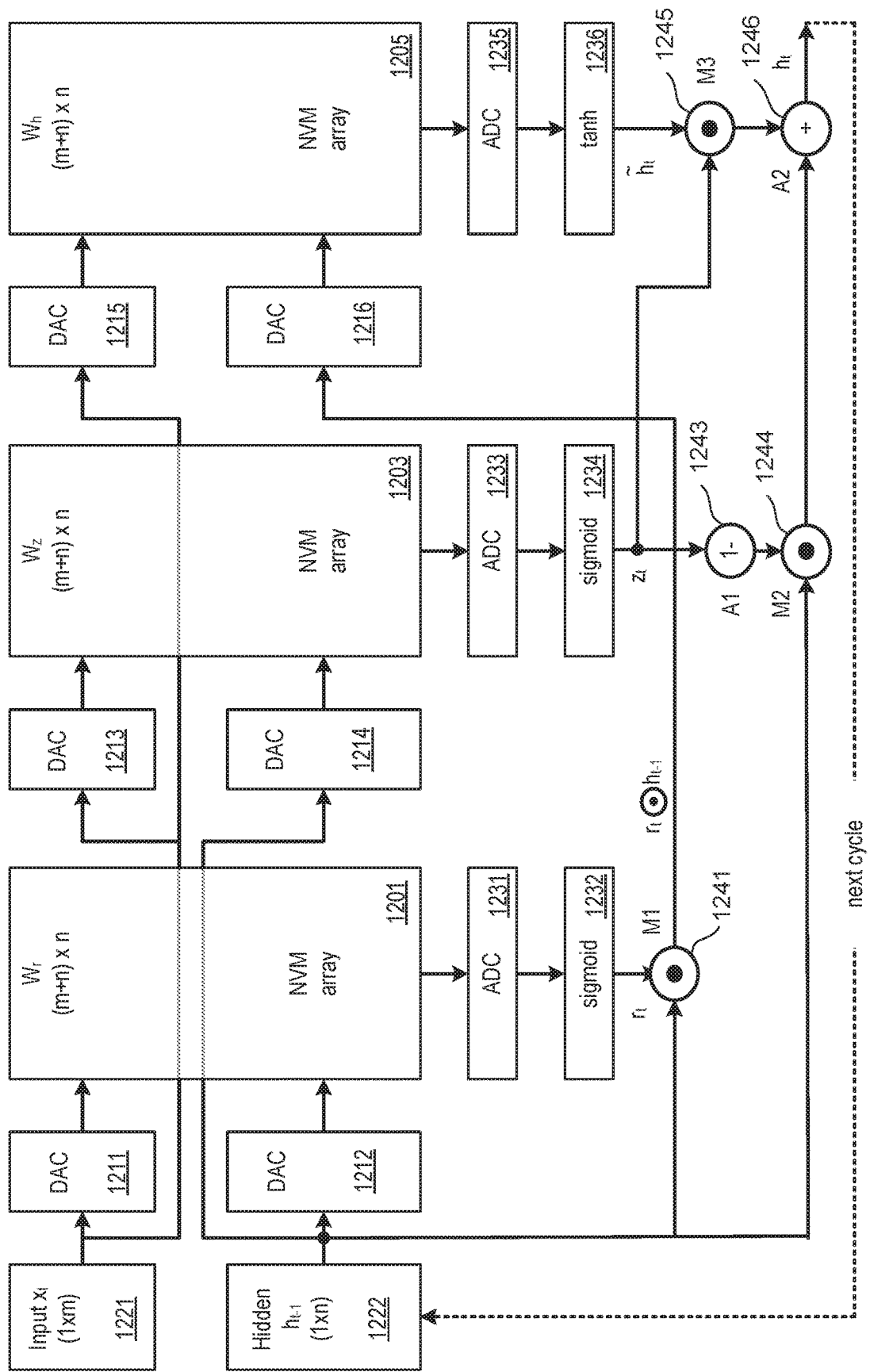
FIG. 12 is a block diagram of one embodiment of an architecture for a GRU-based process-in-memory RNN inference accelerator.
Figure 13:
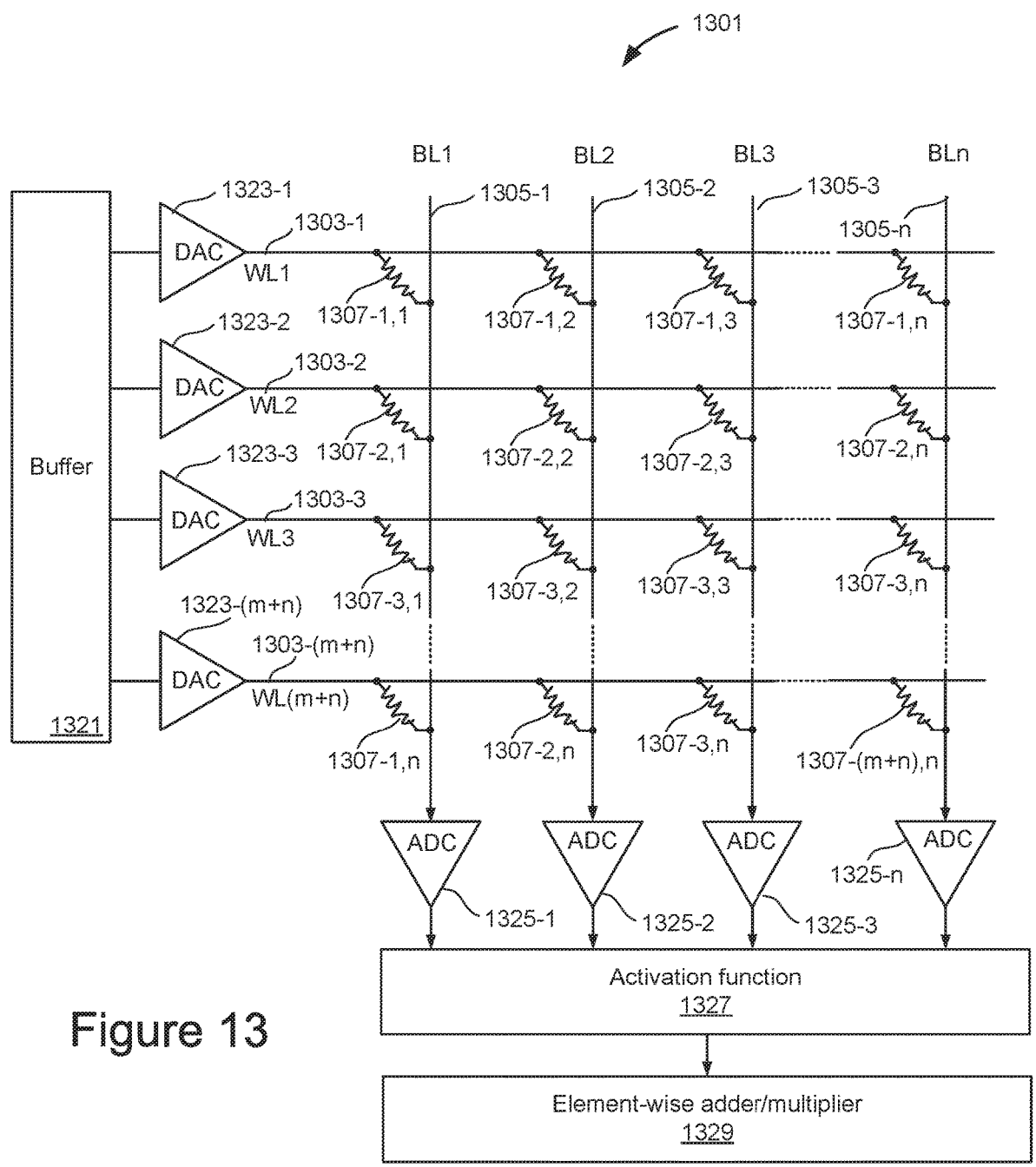
FIG. 13 illustrates an embodiment for a memory array, such as the memory arrays of FIG. 12, in more detail.

FIG. 12 is a block diagram of one embodiment of an architecture for a GRU-based process-in-memory RNN inference accelerator. The embodiment of FIG. 12 includes three non-volatile memory arrays: array 1201 for the weights $W_r$, array 1203 for the weights $W_z$, and array 1205 for the weights $W_h$. The RNN cell's external input $x_t$ at time t has m components and the hidden input $h_{t-1}$ from the preceding cycle time (and output $h_t$ of current time) has n components, so that each of arrays 1201, 1203, and 1205 is of size (m+n)×n, where the (m+n)×n memory cells are connected along (m+n) word lines and n bit lines. As represented in FIG. 13, the $x_t$ values are applied to the top m word lines of the arrays 1201, 1203, and 1205 and the $h_{t-1}$ inputs or $h_{t-1}$ derived (i.e., of $r_t \odot h_{t-1}$) inputs are applied to the bottom n word lines of the arrays 1201, 1203, and 1205, but other arrangements can be used, depending on the embodiment.

The $x_t$ input values are represented schematically at block 1221, where this can represent a buffer for holding the $x_t$ values, where these external input for the cycle can be supplied from a controller, host, or other source external to the memory die. In the embodiment of FIG. 12, the $x_t$ values are digital values that are converted to corresponding analog voltages by one or more digital to analog converters (DACs). In the embodiment of FIG. 12, each of array 1201, 1203, and 1205 has a respective DAC 1211, 1213, and 1215 to bias the corresponding word lines of the arrays. The hidden inputs $h_{t-1}$ values are represented schematically at 1222, where this can represent a buffer for holding the $h_{t-1}$ values from a preceding cycle. In the embodiment of FIG. 12, the $h_t$ (and, consequently, $h_{t-1}$) values are digital values that are converted to corresponding analog voltages by one or more digital to analog converters (DACs). In the embodiment of FIG. 12, each of array 1201, 1203, and 1205 has a respective DAC 1212, 1214, and 1216 to bias the corresponding word lines of the arrays, where, in the case of the $W_h$ 1205 the $h_{t-1}$ value is not applied directly, but rather the derived value of $r_t \odot h_{t-1}$. The blocks 1221 and 1222 and DACs 1211-1216, along with corresponding word line drivers and other elements, can be considered part of the row decode circuits 324 of FIGS. 5 and 6A, which in turn can be considered part of one or more control circuits that are configured to perform an inferencing operation for the RNN.

The output along the bit lines of each of array 1201, 1203, and 1205 is received at a corresponding analog to digital converter (ADC) 1231, 1233, and 1235, where the digital outputs are in turn input into a corresponding activation function. In the embodiment of FIG. 12, these are non-linear activation functions of the sigmoid activations 1232 and 1234 for the $W_r$ array 1201 and the $W_z$ array 1203 and the tan h activation 1236 for the $W_h$ array 1205. The resultant output of the sigmoid activations 1232 and 1234 are then:

$$r_t = \text{sigmoid}([x_t, h_{t-1}]W_r), \text{ and}$$

$$z_t = \text{sigmoid}([x_t, h_{t-1}]W_z),$$

as given above with respect to the description of FIG. 11.

The output $r_t$ from sigmoid activation 1232 then undergoes element-wise multiplication with $h_{t-1}$ at (element-wise) multiplier M1 1241 to provide $r_t \odot h_{t-1}$, which then goes to DAC 1216 to provide input for n word lines of the weight array $W_h$. The output of the corresponding ADC 1235 then goes to an activation function of, in this embodiment, the non-linear tan h activation, generating:

$$\tilde{h}_t = \tan h([x_t, r_t \odot h_{t-1}]W_h),$$

as also described above with respect to FIG. 11. To generate the final cell output of $h_t$, adder, A1 1243 subtracts $z_t$ from 1 to generate (1-$z_t$), and (element-wise) multiplier M2 1244 multiplies (1-$z_t$) by $h_{t-1}$ to form a first input of adder A2 1246. The second input to the adder A2 1246 is from adder M3 1245 that forms the (element-wise) product of $\tilde{h}_t$ and $z_t$ to provide the desired output of the GRU cell at time t of:

$$h_t = (1-z_t) \odot h_{t-1} + z_t \odot \tilde{h}_t$$

The output $h_t$ is both the output at time t and is also looped back to the buffer or block 1222 to server as the hidden state input in the next loop.

FIG. 13 illustrates an embodiment for a memory array, such as the memory arrays of FIG. 12, in more detail. More specifically, FIG. 13 represents a memory array 1301 along with some its peripheral circuitry that can correspond any of the arrays 1201, 1203, and 1205 and their corresponding peripheral circuitry. The peripheral circuitry of FIG. 13 includes a buffer array 1321, which can be taken to correspond to the combined $x_t$ input block 1221 and $h_{t-1}$ block 1222. A set of input DACs 1323-$i$ are connected to the buffer array 1321 to drive each of the word lines WL-i 1303-$i$ of the array 1301 and can be taken to correspond to DACs 1211 and 1212 in the case of array 1201, for example. A set of output ADCs 1325-$j$ are connected along each of the bit lines BL-j 1305-$j$ and can be taken to correspond to ADC 1231 in the case of array 1201, for example. (Although FIG. 13 illustrates one ADC per bit line, in other embodiments a column multiplexer can be used to share ADCs between multiple bit lines.) The output of the ADCs 1325-$j$ goes to the activation function unit 1327, where this can be sigmoid activation function as in the case of 1232 and 1234, a tan h activation function as in the case of 1236, or other activation function, depending on the embodiment. The activation function unit 1327 can then be followed by an element-wise adder or multiplier 1329, such M1 1241, A1 1243, or M3 1245 in FIG. 12.

The memory array 1301 is made up of non-volatile memory cells 1307-$ii$ formed along word lines WL-i 1303-$i$ and bit lines BL-j 1305-$j$. For example, the array can be of the storage class memory type, where each memory cell 1307-$ii$ is connected between a word line WL-i 1303-$i$ and a bit line BL-j 1305-$j$. Depending on the embodiment, the memory cells can be binary valued or multi-bit valued, as can the inputs for the activations. For example, each of the weight values and input values could 4-bit quantization, so that that each of the memory cells 130741 would be programmed to resistance value corresponding to one value of a 4-bit weight value and each of the word lines WL-i 1303-$i$ would be biased by the corresponding DAC 1323-$i$ to a voltage level corresponding to one value of a 4-bit activation. The resultant current on the bit line BL-j 1305-$j$ will depend on the product of the activation value and the weight value and can encoded into a corresponding 4-bit digital value by ADC-j 1325-$j$.

The in-array multiplication of the input/activation values with the weights can be performed in a number of ways, depending on the embodiment. For example, all of the word lines and bit lines of the array can be activated at the same time, for a fully analog computing implementation. In other embodiments, one or both of the word lines or bit lines can be activated sequentially or in subsets. For example, to reduce the power budget or improve reliability problems that can arise from parasitics on bit lines or bit lines, the word lines could be activated sequentially with multiple bit lines activated concurrently; or multiple word lines could activated concurrently with the bit lines activated sequentially.

Relative to FIG. 5 or FIG. 6A, the buffer array 1321 and DACs 1323-$i$ can be considered part of the row decode circuits 324 and the ADCs 1325-$j$, activation function unit 1327, and elementwise multiplier/adder 1329 can be considered part of the read/write circuits 328 and column decoders 332. More generally, these elements are part of the one or more control circuits for performing in-memory inferencing of the RNN. The activation functions can be as represent at the activation logic blocks 313.

Returning back to FIG. 12, the different arrays 1201, 1203, and 1205 along with the peripheral circuitry can be formed on one memory die, although in other embodiments these can be formed on several memory die, such as one array per die. In an embodiment as a bonded die pair, as represented in FIGS. 6A and 6B, the memory arrays 1201, 1203, and 1205 could be part of the array structure 326 formed on the memory die 610 and the other elements of FIG. 12 (the ADCs, DACs, and other peripheral/control circuits) could be part of the control die 608.

In the architecture of the embodiment of FIG. 12, the vector-matrix multiplications of the GRU cell are conducted as in-array operation by the non-volatile memory arrays 1201, 1203, and 1205 in the analog domain. The activation functions, element-wise additions and element-wise multiplications are performed in the digital domain. The resolution of the ADCs and DACs can be optimized by using quantization-aware training.

Figure 14:
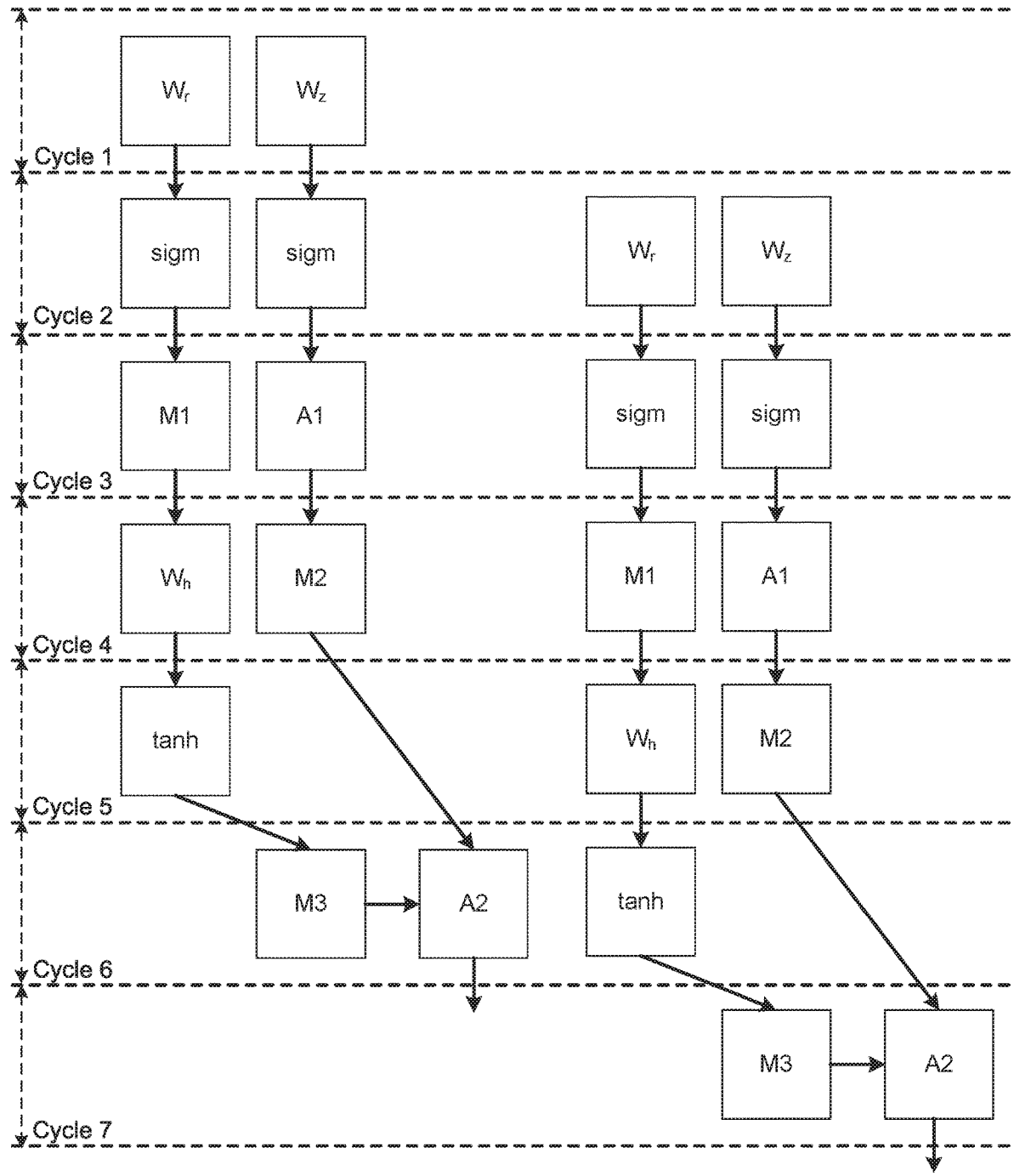
FIG. 14 is a schematic representation for one embodiment of the pipelining of the operation of the RNN cell of FIG. 12.

The latency of the GRU cell of FIG. 13 is:

$$2*T_{VMM}+2*T_{NLA}+2*T_M+T_A$$

where $T_{VMM}$ is the time for the in-array vector-matrix multiplication of inputs and weights, $T_{NLA}$ is the time for the non-linear activations, $T_M$ is the time for an element-wise multiplication, and $T_A$ is the time for an element-wise addition. (The latency calculated in the above equation just counts the major sources of delay, leaving out contributions such as the delay of pipeline registers and glue logic that might be added to support pipelining.) FIG. 14 illustrates an embodiment in which the computation can be executed in six pipelined stages in order to achieve high throughput.

FIG. 14 is a schematic representation for a six-stage embodiment of the pipelining of the operation of the RNN cell of FIG. 12. Starting at the first cycle (cycle 1), an in-array multiplication between the activation inputs ($x_t$ and $h_{t-1}$) and the weight matrices of $W_r$ 1201 and $W_z$ 1203 is performed by applying the corresponding voltage levels from the DACs 1211-1214. Depending on the embodiment, the in-array multiplication at cycle 1 can be performed concurrently for all of the weights and inputs of both $W_r$ 1201 and $W_z$ 1203 or for a subset, with the in-array multiplications performed sequentially as described above with respect to FIG. 13. If performed sequentially, the next multiplication of the next set of the weights and inputs in the sequence for $W_r$ 1201 and $W_z$ 1203 could start at cycle 2. For the in-array multiplications of $W_r$ 1201 and $W_z$ 1203 of cycle 1, the respective activations of 1232 and 1234 are applied in cycle 2. In the embodiment of FIG. 12, these are sigmoid functions and are represented as "sigm" in FIG. 14. In cycle 3 the output of the sigmoid activation 1232 goes to the element-wise multiplication M1 1241 to generate $r_t \odot h_{t-1}$, and the output of the sigmoid activation 1234 goes to the element-wise multiplication A1 1243 to generate $(1-z_t)$.

The activation inputs for the weight matrix $W_h$ 1205 are $x_t$ and $r_t \odot h_{t-1}$, which was generated in cycle 3 by M1 1241. Consequently, the in-array multiplication for $W_h$ 1205 can be performed in cycle 4 and the corresponding activation 1236 (tan h in this embodiment) applied in cycle 5 to generate $\tilde{h}_t$. The output of A1 1243 goes to element-wise multiplier M2 1244 at cycle 4 to generate $(1-z_t) \odot h_{t-1}$. As the output of M2 1244 is not needed until cycle 6, the multiplication of M2 1244 can alternately be moved to cycle 5, in which case the addition of A1 1243 could alternately also be moved down to cycle 4.

At the end of cycle 5, $\tilde{h}_t$ and $z_t$ are both available and go to element-wise multiplier M3 1245 in cycle 6. Also in cycle 6, the output M3 1245 and the output of M2 1244 go to the adder A2 1246 to generate the output $h_t$. The value of $h_t$ can then be provided as an output of the DNN, provided back to buffer/block 1222 to serve as the hidden input at time (t+1), or both. Depending on whether the in-array multiplications in cycles 1 and 4 were for all of the weights and activations or just a portion, the output at the end of cycle 6 may be for the full $h_t$ or just a part of its components. Once the full $h_t$ is available, the DNN can go to time (t+1) inference with $h_t$ as the hidden variable input.

As shown in the right columns of FIG. 14, one the in-array multiplications of $W_r$ 1201 and $W_z$ 1203 are completed for one set of inputs in cycle 1, another set of multiplications can begin in $W_r$ 1201 and $W_z$ 1203 in cycle 2 for the pipelining of another set of inputs. For example, if full array multiplications are performed for the weight matrices and activation inputs, this second pipeline beginning at cycle two can be for a new set of inputs. If the multiplication of the activations and weights is performed sequentially, the set of operations for the pipeline beginning at cycle 2 can be for the next set in the sequence.

In the embodiment of FIG. 14, the GRU-based RNN computation is separated into a six-stage pipeline. For other design embodiments, the number of pipeline stages can be reduced to reduce latency (without decreasing clock rate) and silicon costs (by reducing the number of pipeline registers). For example, in alternate embodiments stages 2 and 3 can be merged, as can steps 5 and 6, as these are not in the critical path.

Figure 15:
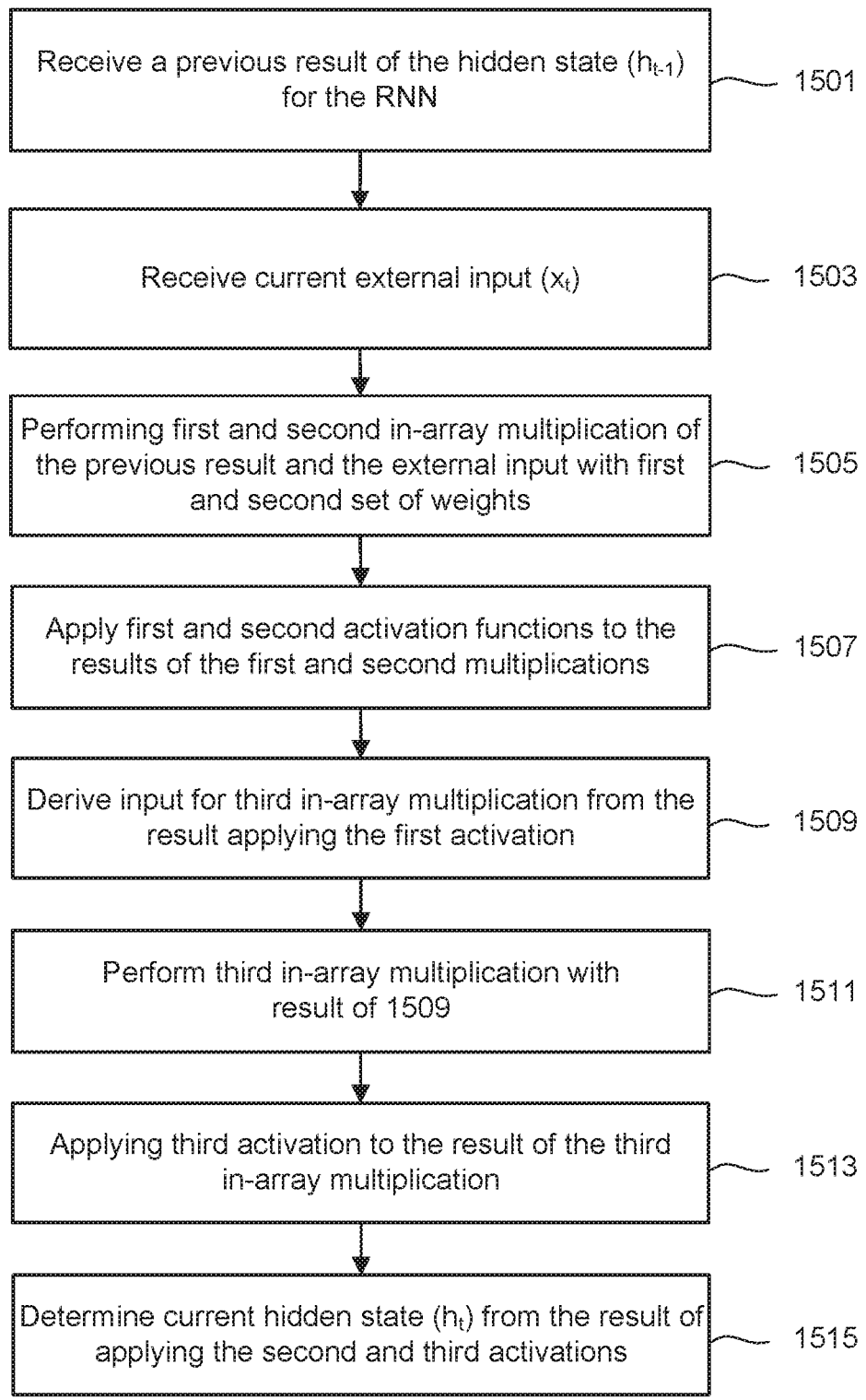
FIG. 15 is a flowchart of one embodiment for the operation of the GRU-based RNN of FIGS. 12-14.

FIG. 15 is a flowchart of one embodiment for the operation of the GRU-based RNN of FIGS. 12-14. At step 1501, the result of the hidden state from a previous time, $h_{t-1}$, is received. This value can be held in block/buffer 1222. If an external input for time t, $x_t$, is also going to be input, this is received at step 1503 and can held in block/buffer 1221. With the $x_t$ and $h_{t-1}$ values as input, an iteration of the RNN of FIG. 12 can run as in the pipelined arrangement of FIG. 14.

At step 1505, the in-array multiplication between the inputs [$x_t$, $h_{t-1}$] and the weight matrices of $W_r$ 1201 and $W_z$ 1203 is performed by applying the corresponding voltage levels from the DACs 1211-1214. The in-array multiplication can be performed concurrently for all of the weights and inputs of both $W_r$ 1201 and $W_z$ 1203 of for a subset, with the in-array multiplications performed sequentially as described above with respect to FIG. 13. If performed sequentially, the next multiplication of the next set of the weights and inputs in the sequence for $W_r$ 1201 and $W_z$ 1203 would be performed in a loop back through the flow. For the in-array multiplications of $W_r$ 1201 and $W_z$ 1203 of step 1505, the respective activations of 1232 and 1234 are applied in step 1507. In the embodiment of FIG. 12, these are sigmoid functions.

At step 1509, the input for a third in-array multiplication is derived from the result applying the first activation (from 1232). More specifically, the output of the sigmoid activation 1232 goes to the element-wise multiplication M1 1241 to generate $r_t \odot h_{t-1}$. This value, along with $x_t$, are then used to perform a third in-array multiplication with $W_h$ 1205 at step 1511. At step 1513, the corresponding activation 1236 (tan h in this embodiment) applied to the in-array multiplication of step 1511 to generate $\tilde{h}_4$.

In step 1515 the output $h_t$ for time t is determined from the result of the second activation of step 1507 and the result of the third activation of step 1511. In the embodiment of FIG. 12, the result $z_t$ of the second activation goes to adder A1 1243, and the output of A1 1243 goes to element-wise multiplier M2 1244 to generate $(1-z_t) \odot h_{t-1}$. The results of the third activation in step 1513, $\tilde{h}_t$, and the result of the second activation in step 1507, $z_t$, go to element-wise multiplier M3 1245. The output M3 1245 and the output of M2 1244 go to the adder A2 1246 to generate the output $h_t$. The result $h_t$ can then be used as the hidden input for an iteration of the RNN at time (t+1).

The embodiments of a GRU-based compute in memory RNN described above with respect to FIGS. 12-15 have a number of advantages over other implementations. One advantage is that the disclosed architecture is highly resistant to noise, even when using a relatively low (e.g., 4-bit) quantization level. The architecture also requires low power and small area relative to other approaches. The embodiments described above can be implemented with a number of different technologies for the memory arrays FIGS. 12 and 13. Memory arrays based on storage class memory such ReRAM, PCM, MRAM, FeRAM and other non-volatile memory technologies can be incorporated for the non-volatile memory arrays with little modification.

In a first set of embodiments, a non-volatile memory device includes a plurality of memory arrays and one or more control circuits connected to the plurality of memory arrays. Each of the memory arrays has plurality of non-volatile memory cells and includes: a first memory array configured to store a first set of weights for a recurrent neural network (RNN); a second memory array configured to store a second set of weights for the RNN; and a third memory array configured to store a third set of weights for the RNN. The one or more control circuits are configured to: perform a first in-array multiplication between a first input and the first set of weights in the first memory array; perform a second in-array multiplication between the first input and the second set of weights in the second memory array; derive an input for a third in-array multiplication from a result of the first in-array multiplication; perform the third in-array multiplication between the input for third in-array multiplication and the third set of weights in the third memory array; and deriving an output for a current cycle of the RNN from a combination of the second in-array multiplication and the third in-array multiplication, where the first input is an output of a previous cycle of the RNN.

In additional embodiments, a method includes receiving a first input for a cycle of a recurrent neural network (RNN), performing a first in-array multiplication between the first input and a first set of weights for the RNN stored in a first array of a non-volatile memory die, and performing a second in-array multiplication between the first input and a second set of weights for the RNN stored in a second array of a non-volatile memory die. An input for a third in-array multiplication is generated from a result of the first in-array multiplication and the third in-array multiplication is performed between the input for the third in-array multiplication and a third set of weights for the RNN stored in a third array of the non-volatile memory die. An output for the cycle of the RNN is determined from a combination of a result of the second in-array multiplication and the third in-array multiplication.

Further embodiments include a non-volatile memory device having a plurality of memory arrays having a plurality non-volatile memory cells configured to store weight values of a Gated Recurrent Unit (GRU) cell of a recurrent neural network (RNN) and a buffer configured to hold an external input for a current cycle of the RNN and a hidden state output from a preceding cycle of the RNN. On or more control circuits are connected to the plurality of memory arrays and the buffer. The one or more control circuits are configured to perform a plurality of in-array multiplication with the weight values the GRU cell to propagate the external input for the current cycle of the RNN and the hidden state output from the preceding cycle of the RNN though the GRU cell to generate a hidden state output for the current cycle of the RNN.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory device, comprising:
 a plurality of memory arrays each having a plurality of non-volatile memory cells, including:
  a first memory array configured to store a first set of weights for a recurrent neural network (RNN);
  a second memory array configured to store a second set of weights for the RNN; and
  a third memory array configured to store a third set of weights for the RNN; and
 one or more control circuits connected to the plurality of memory arrays, the one or more control circuits configured to:
  receive a first input as a first digital value;
  convert the first input from the first digital value to a first analog input;
  perform a first in-array multiplication between the first input and the first set of weights in the first memory array by applying the first analog input to the first memory array and converting a result of the first in-array multiplication to a digital value;
  perform a second in-array multiplication between the first input and the second set of weights in the second memory array by applying the first analog input to the second memory array and converting a result of the second in-array multiplication to a digital value;
  derive an input for a third in-array multiplication from the digital value of the result of the first in-array multiplication;

convert the derived input for the third in-array multiplication to a second analog input;
perform the third in-array multiplication between the input for third in-array multiplication and the third set of weights in the third memory array by applying the second analog input to the third memory array and converting a result of the third in-array multiplication to a digital value; and
deriving an output for a current cycle of the RNN from a combination of the digital value of the second in-array multiplication and the digital value of the third in-array multiplication, where the first input is an output of a previous cycle of the RNN.

2. The non-volatile memory device claim 1, comprising: a bonded die pair, comprising:
a memory die including the plurality of memory arrays; and
a control die, formed separately from and bonded to the memory die and including the one or more control circuits.

3. The non-volatile memory device of claim 1, wherein the plurality of memory arrays and the one or more control circuits are formed on a shared memory die.

4. The non-volatile memory device of claim 1, wherein the one or more control circuits are further configured to:
further perform the first in-array multiplication between an external input and the first set of weights in the first memory array;
further perform the second in-array multiplication between the external input and the second set of weights in the second memory array; and
further perform the third in-array multiplication between the external input and the third set of weights in the third memory array.

5. The non-volatile memory device of claim 1, wherein the one or more control circuits are to derive the input for the third in-array multiplication by applying a first activation function to the result of the first in-array multiplication, and
wherein deriving an output for a current cycle of the RNN includes applying a second activation function to a result of the second in-array multiplication and applying a third activation function to a result of the third in-array multiplication.

6. The non-volatile memory device claim 5, wherein first and second activation functions are sigmoid functions and the third activation function is a hyperbolic tangent function.

7. The non-volatile memory device claim 1, wherein the non-volatile memory cells are formed of a storage class memory technology.

8. The non-volatile memory device of claim 1, wherein the non-volatile memory cells are configured to store values for the sets of weights in a multi-state format.

9. A method, comprising:
receiving a first input for a cycle of a recurrent neural network (RNN);
performing a first in-array multiplication between the first input and a first set of weights for the RNN stored in a first array of a non-volatile memory die by:
converting the first input from a digital value to an analog value, and
applying the analog value of the first input to the first array and converting the result of the first in-array multiplication from an analog value to a digital value;
performing a second in-array multiplication between the first input and a second set of weights for the RNN stored in a second array of a non-volatile memory die by:
applying the analog value of the first input to the second array and converting the result of the second in-array multiplication from an analog value to a digital value;
generating an input for a third in-array multiplication from a result of the first in-array multiplication;
performing third in-array multiplication between the input for the third in-array multiplication and a third set of weights for the RNN stored in a third array of the non-volatile memory die by:
converting the input for the third in-array multiplication from a digital value, and
applying the analog value of the input for the third in-array multiplication to the third array and converting the result of the third in-array multiplication from an analog value to a digital value; and
determining an output for the cycle of the RNN from a combination of a result of the second in-array multiplication and the third in-array multiplication.

10. The method of claim 9, wherein the first in-array multiplication and the second in-array multiplication are performed concurrently.

11. The method of claim 9, wherein the first input is an output of a previous cycle of the RNN.

12. The method of claim 11, wherein:
performing the first in-array multiplication further includes multiplying an external input for the cycle of the RNN and the first set of weights for the RNN stored in the first array of the non-volatile memory die;
performing the second in-array multiplication further includes multiplying the external input for the cycle of the RNN and the second set of weights for the RNN stored in the second array of the non-volatile memory die; and
performing the third in-array multiplication further includes multiplying the external input for the cycle of the RNN and the third set of weights for the RNN stored in the third array of the non-volatile memory die.

13. The method of claim 9, further comprising:
prior to generating an input for the third in-array multiplication from a result of the first in-array multiplication, applying a first activation function to the result of the first in-array multiplication; and
prior to determining the output for the cycle of the RNN from a combination of a result of the second in-array multiplication and the third in-array multiplication, applying a second activation function to the result of the second in-array multiplication and applying a third activation function to the result of the third in-array multiplication.

14. The method claim 13, wherein the first and second activation functions are sigmoid functions and the third activation function is a hyperbolic tangent function.

15. The method of claim 9, further comprising:
using the output of the cycle of the RNN as input for a subsequent cycle of the RNN.

16. A non-volatile memory device, comprising:
a plurality of memory arrays having a plurality non-volatile memory cells configured to store weight values of a Gated Recurrent Unit (GRU) cell of a recurrent neural network (RNN);

a buffer configured to hold an external input for a current cycle of the RNN and a hidden state output from a preceding cycle of the RNN; and one or more control circuits connected to the plurality of memory arrays and the buffer, the one or more control circuits configured to perform a plurality of in-array multiplications with the weight values the GRU cell to propagate the external input for the current cycle of the RNN and the hidden state output from the preceding cycle of the RNN though the GRU cell to generate a hidden state output for the current cycle of the RNN, where, to perform each of the plurality of in-array multiplications, the one or more control circuits are configured to:

receive a digital valued input vector for the in-array multiplication;

convert the digital valued input vector to an analog valued input vector;

apply the analog valued input vector to the memory array; and convert a result of the in-array multiplication to a digital value.

17. The non-volatile memory device claim 16, comprising:

a bonded die pair, comprising:

a memory die including the plurality of memory arrays; and a control die, formed separately from and bonded to the memory die and including the one or more control circuits.

18. The non-volatile memory device of claim 16, wherein the plurality of memory arrays and the one or more control circuits are formed on a shared memory die.

19. The non-volatile memory device of claim 16, wherein the plurality of memory arrays include a first memory array storing a first set of weights, a second memory array storing a second set of weights, and a third memory storing a third set of weights, the plurality of in-array multiplications including:

a first in-array multiplication between the external input for the current cycle of the RNN and the hidden state output from the preceding cycle of the RNN with the first set of weights in the first memory array;

a second in-array multiplication between the external input for the current cycle of the RNN and the hidden state output from the preceding cycle of the RNN with the second set of weights in the second memory array; and a third in-array multiplication between the external input for the current cycle of the RNN and an input derived from a result of the first in-array multiplication from the preceding cycle of the RNN with the third set of weights in the third memory array.

20. The non-volatile memory device of claim 19, wherein the one or more control circuits are to derive the input for the third in-array multiplication by applying a first activation function to the result of the first in-array multiplication, and wherein deriving an output for a current cycle of the RNN includes applying a second activation function to a result of the second in-array multiplication and applying a third activation function to a result of the third in-array multiplication.

* * * * *